United States Patent
Hwang et al.

(10) Patent No.: US 12,183,742 B2
(45) Date of Patent: *Dec. 31, 2024

(54) SEMICONDUCTOR DEVICE

(71) Applicant: SAMSUNG ELECTRONICS CO., LTD., Suwon-si (KR)

(72) Inventors: Yoon Tae Hwang, Seoul (KR); Sunjung Lee, Suwon-si (KR); Heonbok Lee, Suwon-si (KR); Geunwoo Kim, Seoul (KR); Wandon Kim, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/600,403

(22) Filed: Mar. 8, 2024

(65) Prior Publication Data

US 2024/0250088 A1  Jul. 25, 2024

Related U.S. Application Data

(63) Continuation of application No. 17/886,878, filed on Aug. 12, 2022, now Pat. No. 11,955,487, which is a (Continued)

(30) Foreign Application Priority Data

Oct. 2, 2019 (KR) ........................ 10-2019-0122554

(51) Int. Cl.
 *H01L 27/092* (2006.01)
 *H01L 21/8238* (2006.01)

(52) U.S. Cl.
 CPC .. *H01L 27/0924* (2013.01); *H01L 21/823814* (2013.01); *H01L 21/823821* (2013.01); *H01L 21/823871* (2013.01)

(58) Field of Classification Search
 CPC ......... H01L 27/0924; H01L 21/823814; H01L 21/823821; H01L 21/823871
 See application file for complete search history.

(56) References Cited

U.S. PATENT DOCUMENTS 9,012,281 B2  4/2015  Suk et al.
9,515,150 B2  12/2016  Xiong et al.
(Continued)

FOREIGN PATENT DOCUMENTS

KR  2014-0101218  8/2014
KR  2016-0079600  7/2016
KR  2017-0102660  9/2017

OTHER PUBLICATIONS

Office Action in Korean Appln. No. 10-2019-0122554, mailed on Oct. 8, 2024, 20 pages (with Machine translation).

*Primary Examiner* — Christine A Enad
(74) *Attorney, Agent, or Firm* — Fish & Richardson P.C.

(57) ABSTRACT

A semiconductor device includes a first and second channel patterns on a substrate, each of the first and second channel patterns including vertically-stacked semiconductor patterns; a first source/drain pattern connected to the first channel pattern; a second source/drain pattern connected to the second channel pattern, the first and second source/drain patterns having different conductivity types; a first contact plug inserted in the first source/drain pattern, and a second contact plug inserted in the second source/drain pattern; a first interface layer interposed between the first source/drain pattern and the first contact plug; and a second interface layer interposed between the second source/drain pattern and the second contact plug, the first and second interface layers including different metallic elements from each other, a bottom portion of the second interface layer being positioned at a level that is lower than a bottom surface of a topmost one of the semiconductor patterns.

20 Claims, 30 Drawing Sheets

Related U.S. Application Data continuation of application No. 16/898,719, filed on Jun. 11, 2020, now Pat. No. 11,417,656.

(56) References Cited

U.S. PATENT DOCUMENTS

| | | |
|---|---|---|
| 9,653,462 B2 | 5/2017 | Suk et al. |
| 9,704,865 B2 | 7/2017 | Lee et al. |
| 10,032,672 B1 | 7/2018 | Hung et al. |
| 10,056,454 B2 | 8/2018 | Kim et al. |
| 10,068,969 B2 | 9/2018 | Tung |
| 10,164,012 B2 | 12/2018 | Fung et al. |
| 11,417,656 B2 * | 8/2022 | Hwang ............. H01L 29/41766 |
| 11,955,487 B2 * | 4/2024 | Hwang ................. H01L 21/743 |
| 2009/0315185 A1 | 12/2009 | Boyanov et al. |
| 2015/0221768 A1 | 8/2015 | Zhong et al. |
| 2016/0315088 A1 | 10/2016 | Kang et al. |
| 2018/0005903 A1 | 1/2018 | Basker et al. |
| 2018/0122646 A1 | 5/2018 | Adusumilli et al. |
| 2018/0175035 A1 | 6/2018 | Yang et al. |
| 2018/0233417 A1 | 8/2018 | Pranatharthiharan et al. |
| 2019/0074362 A1 * | 3/2019 | Lee ................... H01L 29/42392 |
| 2020/0227313 A1 | 7/2020 | Choi et al. |
| 2020/0251593 A1 * | 8/2020 | Miao ................... H01L 29/7843 |

\* cited by examiner

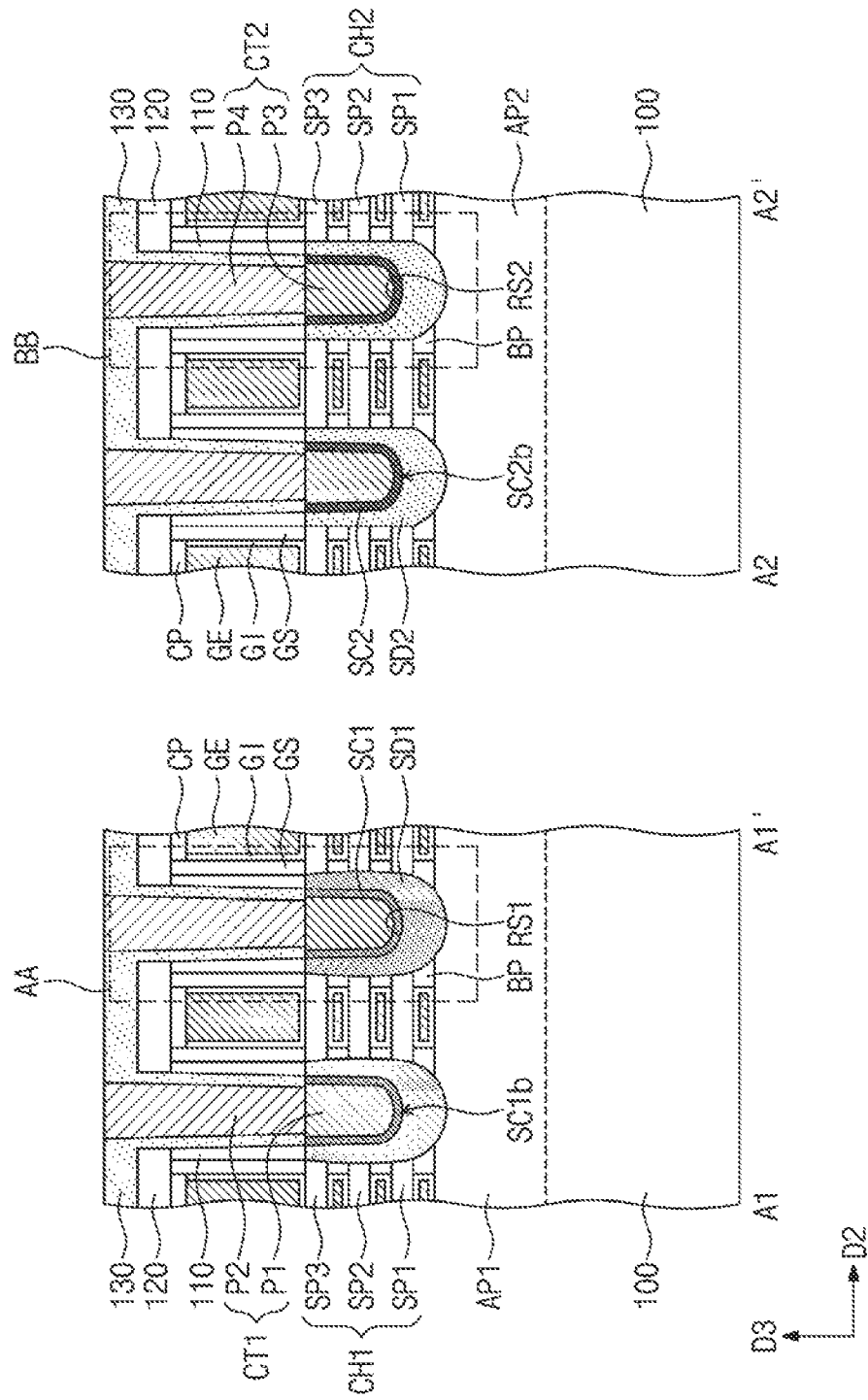

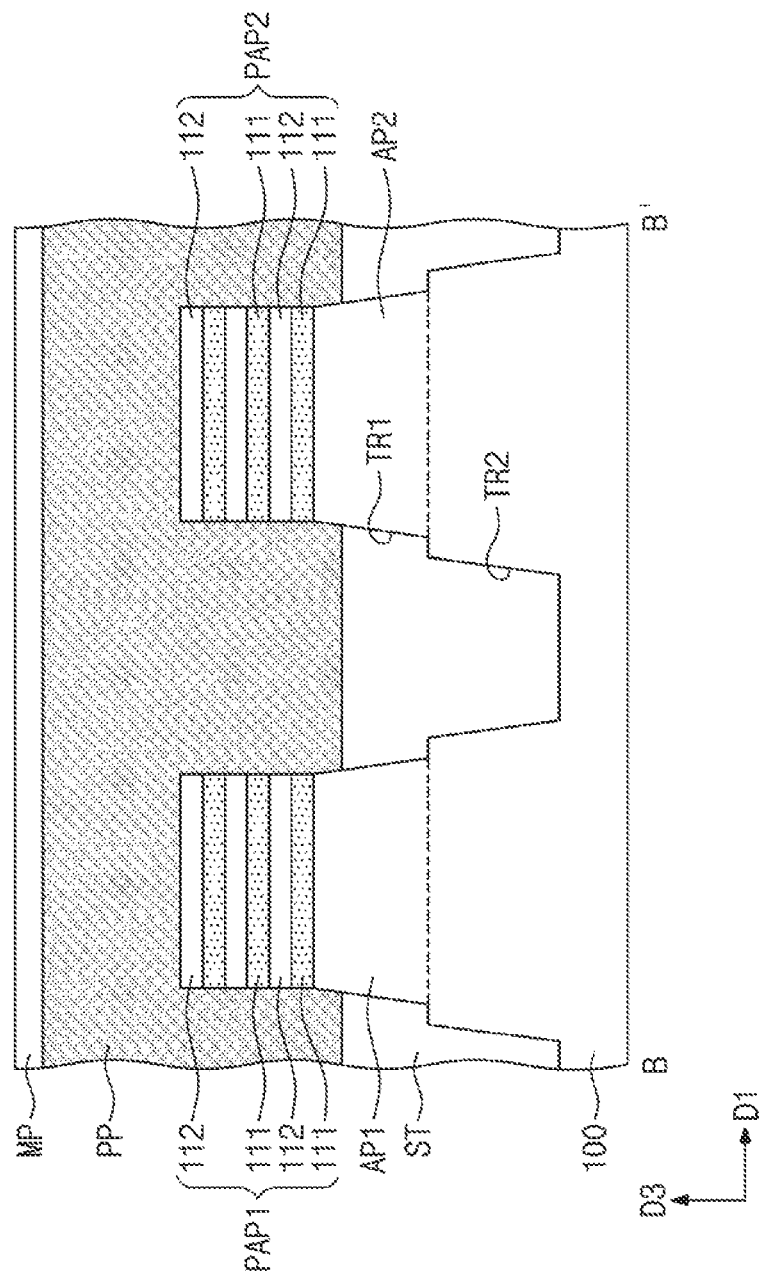

SEMICONDUCTOR DEVICE

CROSS-REFERENCE TO RELATED APPLICATIONS

This application is a continuation of pending U.S. application Ser. No. 17/886,878, filed Aug. 12, 2022, which is a continuation of U.S. application Ser. No. 16/898,719, filed on Jun. 11, 2020, now U. S. Pat. No. 11,417,656, the entire contents of which each is hereby incorporated by reference. This application claims priority to Korean Patent Application No. 10-2019-0122554, filed on Oct. 2, 2019, in the Korean Intellectual Property Office, and entitled: "Semiconductor Device," which is incorporated by reference herein in its entirety.

BACKGROUND

1. Field

Embodiments relate to a semiconductor device.

2. Description of the Related Art

Due to their small-sized, multifunctional, and/or low-cost characteristics, semiconductor devices are being esteemed as important elements in the electronic industry. The semiconductor devices are classified into a semiconductor memory device for storing data, a semiconductor logic device for processing data, and a hybrid semiconductor device including both of memory and logic elements. As the electronic industry advances, there is an increasing demand for semiconductor devices with improved characteristics. For example, there is an increasing demand for semiconductor devices with high reliability, high performance, and/or multiple functions. To meet this demand, complexity and/or integration density of semiconductor devices are being increased.

SUMMARY

Embodiments are directed to a semiconductor device, including a first channel pattern and a second channel pattern on a substrate, each of the first and second channel patterns including vertically-stacked semiconductor patterns; a first source/drain pattern connected to the first channel pattern; a second source/drain pattern connected to the second channel pattern, the first and second source/drain patterns having different conductivity types from each other; a first contact plug inserted in the first source/drain pattern, and a second contact plug inserted in the second source/drain pattern; a first interface layer interposed between the first source/drain pattern and the first contact plug; and a second interface layer interposed between the second source/drain pattern and the second contact plug, the first and second interface layers including different metallic elements from each other, a bottom portion of the second interface layer being positioned at a level that is lower than a bottom surface of a topmost one of the semiconductor patterns.

Embodiments are also directed to a semiconductor device, including semiconductor patterns vertically stacked on a substrate; a gate electrode extended in a first direction to fill a space between the semiconductor patterns; a source/drain pattern disposed at a side of the gate electrode and connected to the semiconductor patterns; an interlayered insulating layer covering the gate electrode and the source/drain pattern; a contact plug including a first portion, which is buried in the source/drain pattern, and a second portion, which penetrate the interlayered insulating layer and is connected to the first portion; an interface layer between the first portion and the source/drain pattern; and a metal oxide between the second portion and the interlayered insulating layer.

Embodiments are also directed to a semiconductor device, including a substrate having a first active region and a second active region; a first channel pattern on the first active region, and a second channel pattern on the second active region, and each of the first channel pattern and the second channel pattern including vertically-stacked semiconductor patterns; a gate electrode extended in a first direction to cross the first and second channel patterns; a first source/drain pattern disposed at a side of the gate electrode and connected to the first channel pattern; a second source/drain pattern disposed at a side of the gate electrode and connected to the second channel pattern, and having a different conductivity type from the first source/drain pattern; an interlayer insulating layer covering the gate electrode, the first source/drain pattern, and the second source/drain pattern; a first contact plug including a first portion, which is buried in the first source/drain pattern, and a second portion, which penetrates the interlayer insulating layer and is connected to the first portion; a second contact plug including a third portion, which is buried in the second source/drain pattern, and a fourth portion, which penetrates the interlayer insulating layer and is connected to the third portion; a first interface layer interposed between the first portion and the first source/drain pattern; and a second interface layer interposed between the third portion and the second source/drain pattern, the first and second interface layers including different elements from each other.

Embodiments are also directed to a semiconductor device, including a first channel pattern and a second channel pattern on a substrate, each of the first and second channel patterns including vertically-stacked semiconductor patterns; a first source/drain pattern connected to the first channel pattern; a second source/drain pattern connected to the second channel pattern, the first and second source/drain patterns having different conductivity types from each other; a first contact plug inserted in the first source/drain pattern, and a second contact plug inserted in the second source/drain pattern; a first interface layer interposed between the first source/drain pattern and the first contact plug; and a second interface layer interposed between the second source/drain pattern and the second contact plug, a bottom portion of the second interface layer being positioned at a level that is lower than a bottom portion of the first interface layer.

Embodiments are also directed to a method of fabricating a semiconductor device, including forming a first channel pattern and a second channel pattern on a substrate, each of the first and second channel patterns including semiconductor patterns which are vertically stacked; forming a first source/drain pattern and a second source/drain pattern, which are respectively connected to the first channel pattern and the second channel pattern, the second source/drain pattern having a different conductivity type from the first source/drain pattern; forming a first recess region in a top surface of the first source/drain pattern and forming a second recess region in a top surface of the second source/drain pattern; forming an insulating layer to cover an inner side surface of the first recess region; forming a first interface layer to fill a portion of the second recess region and to cover an inner side surface of the second recess region; and forming a first contact plug to fill at least a portion of the first recess region and forming a second contact plug to fill a remaining portion of the second recess region.

BRIEF DESCRIPTION OF THE DRAWINGS

Features will become apparent to those of skill in the art by describing in detail example embodiments with reference to the attached drawings in which:

FIG. 2A illustrates a sectional view taken along lines A1-A1' and A2-A2' of FIG. 1.

FIGS. 11B, 13B, 15B, and 16B illustrate sectional views taken along lines B-B' of FIGS. 12, 14, 14, and 14, respectively.

DETAILED DESCRIPTION

Figure 1:
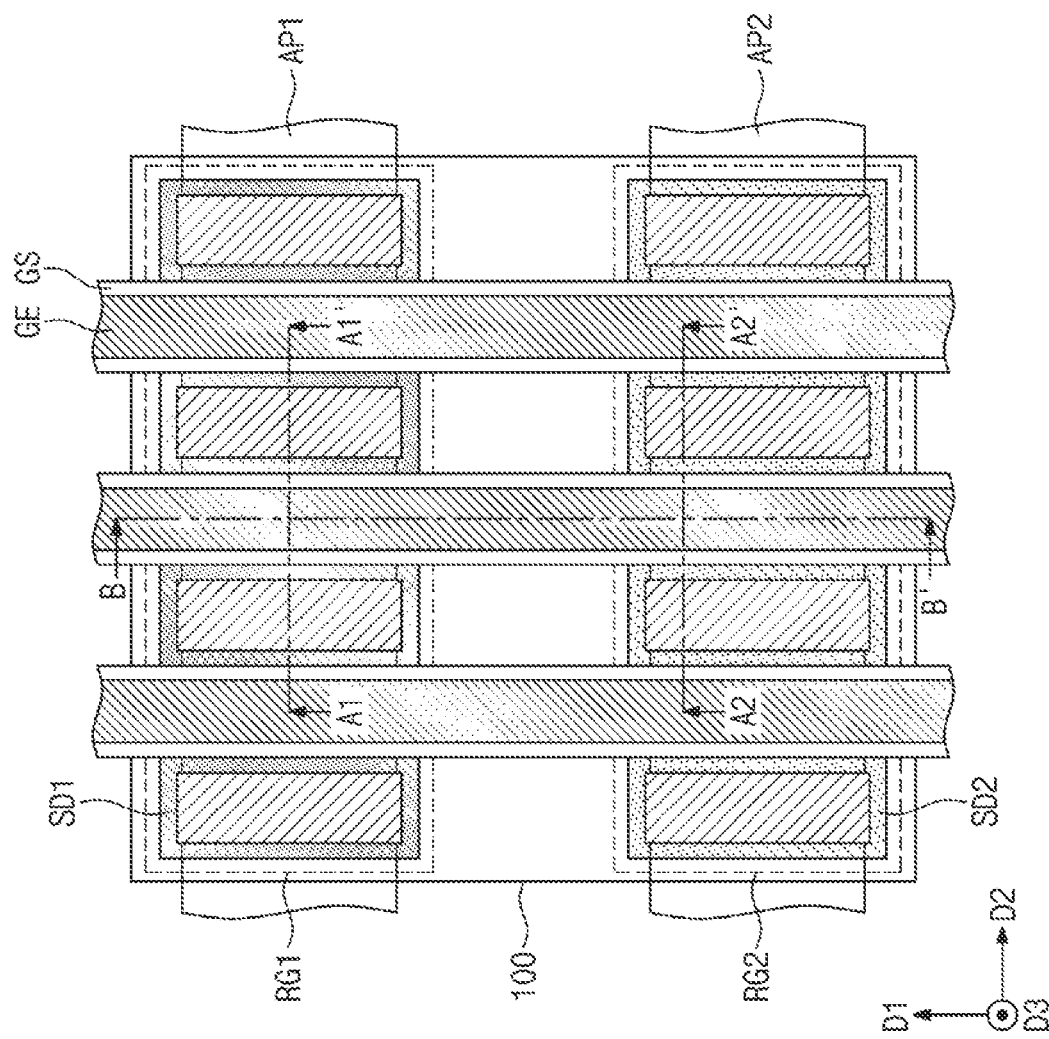
FIG. 1 illustrates a plan view illustrating a semiconductor device according to an example embodiment.
Figure 2B:
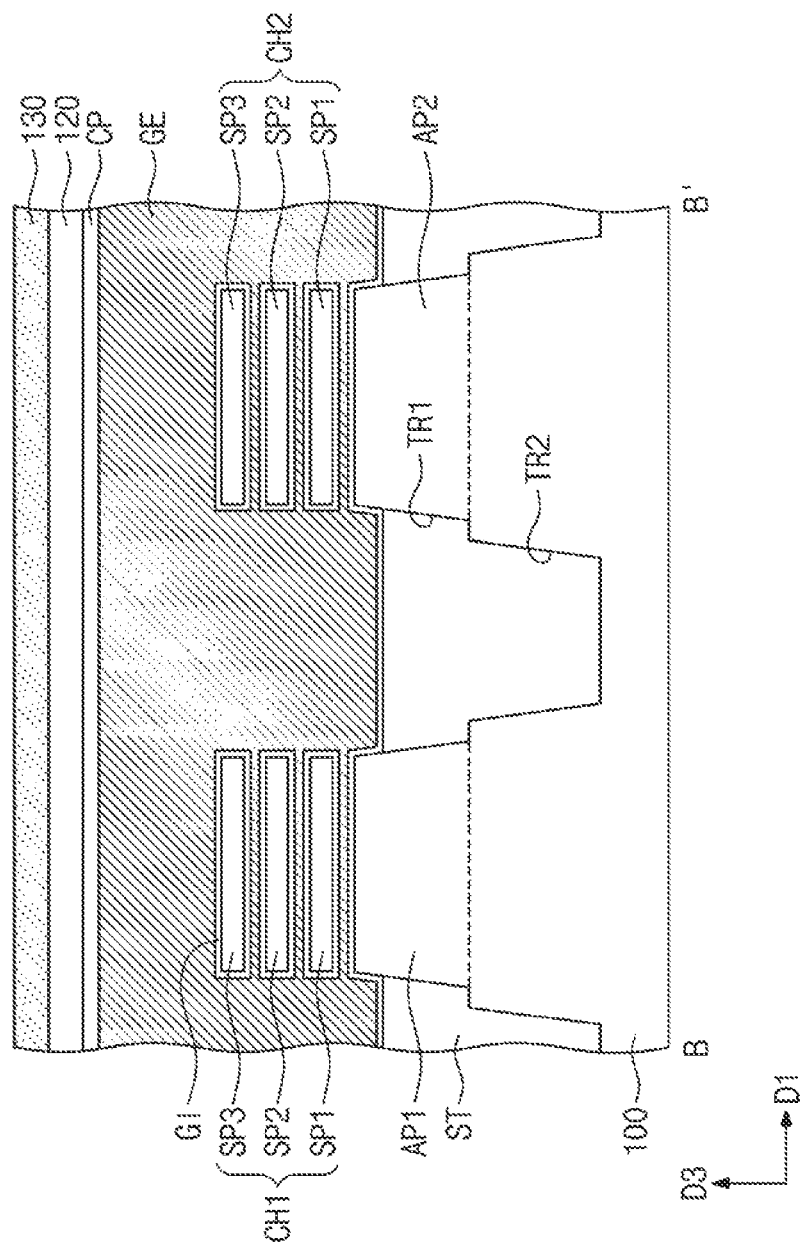
FIG. 2B illustrates a sectional view taken along a line B-B' of FIG. 1.

FIG. 1 is a plan view illustrating a semiconductor device according to an example embodiment. FIG. 2A is a sectional view taken along lines A1-A' and A2-A2' of FIG. 1. FIG. 2B is a sectional view taken along a line B-B' of FIG. 1.

Referring to FIGS. 1, 2A, and 2B, a semiconductor device according to an example embodiment may include a substrate 100 having a first region RG1 and a second region RG2. The substrate 100 may be a semiconductor substrate. For example, the substrate 100 may be a silicon wafer, a germanium wafer, or a silicon-on-insulator (SOI) wafer.

First transistors may be provided on the first region RG1 of the substrate 100, and second transistors may be provided on the second region RG2 of the substrate 100.

In an implementation, the first and second regions RG1 and RG2 of the substrate 100 may be a logic cell region, on which logic transistors constituting a logic circuit of the semiconductor device are disposed. As an example, logic transistors constituting a processor core or I/O terminals may be disposed on the logic cell region of the substrate 100. The first and second transistors may be some of the logic transistors.

In another implementation, the first and second regions RG1 and RG2 of the substrate 100 may be a memory cell region, on which a plurality of memory cells to store data are formed. As an example, a plurality of memory cell transistors constituting the SRAM cells may be disposed on the memory cell region of the substrate 100. The first and second transistors may be some of the memory cell transistors.

The first transistors on the first region RG1 and the second transistors on the second region RG2 may have conductivity types different from each other. For example, the first transistors on the first region RG1 may be PMOSFETs, and the second transistors on the second region RG2 may be NMOSFETs. Thus, the first region RG1 may be a PMOSFET region, and the second region RG2 may be an NMOSFET region.

A device isolation layer ST may be provided on the substrate 100. The device isolation layer ST may define first and second active patterns AP1 and AP2 in an upper portion of the substrate 100. The first active patterns AP1 may be disposed on the first region RG1. The second active patterns AP2 may be disposed on the second region RG2. Each of the first and second active patterns AP1 and AP2 may be a line- or bar-shaped pattern extending in a second direction D2.

The device isolation layer ST may fill first trenches TR1 between the first active pattern AP1 and the second active patterns AP2. The device isolation layer ST may fill a second trench TR2 formed from a bottom surface of the first trench TR1 toward a bottom surface of the substrate 100, between the first region RG1 and the second region RG2. A top surface of the device isolation layer ST may be positioned at a level that is lower than top surfaces of the first and second active patterns AP1 and AP2.

First channel patterns CH1 and first source/drain patterns SD1 may be provided on the first active pattern AP1. Each of the first channel patterns CH1 may be interposed between an adjacent pair of the first source/drain patterns SD1. Second channel patterns CH2 and second source/drain patterns SD2 may be provided on the second active pattern AP2. Each of the second channel patterns CH2 may be interposed between an adjacent pair of the second source/drain patterns SD2.

Each of the first channel patterns CH1 may include first to third semiconductor patterns SP1, SP2, and SP3, which are sequentially stacked on the substrate 100. The first to third semiconductor patterns SP1, SP2, and SP3 may be spaced apart from each other in a third direction D3 that is perpendicular to a top surface of the substrate 100. The first to third semiconductor patterns SP1, SP2, and SP3 may be overlapped with each other when viewed in a plan view, for example, looking downward along the third direction D3. Each of the first source/drain patterns SD1 may be in direct contact with side surfaces of the first to third semiconductor patterns SP1, SP2, and SP3. Thus, the first to third semiconductor patterns SP1, SP2, and SP3 may connect an adjacent pair of the first source/drain patterns SD1 to each other.

The first to third semiconductor patterns SP1, SP2, and SP3 of the first channel pattern CH1 may have the same thickness or different thicknesses. The first to third semiconductor patterns SP1, SP2, and SP3 of the first channel pattern CH1 may differ from each other in their largest lengths, when measured in the second direction D2. The first to third semiconductor patterns SP1, SP2, and SP3 may be formed of or include at least one of silicon (Si), germanium (Ge), or silicon-germanium (SiGe). Although the first channel pattern CH1 is illustrated to have three semiconductor patterns, other numbers of the semiconductor patterns constituting the first channel pattern CH1 may be provided.

Each of the second channel patterns CH2 may include first to third semiconductor patterns SP1, SP2, and SP3, which are sequentially stacked on the substrate 100. The first to third semiconductor patterns SP1, SP2, and SP3 of the second channel pattern CH2 may be configured to have substantially the same features as those of the first channel pattern CH1.

Each of the first source/drain patterns SD1 may be an epitaxial pattern that is grown using the first to third semiconductor patterns SP1, SP2, and SP3 of the first channel pattern CH1 and the first active pattern AP1 as a seed layer. The first source/drain patterns SD1 may include p-type impurities. The first source/drain patterns SD1 may be formed of or include a material capable of exerting a compressive strain on the first channel pattern CH1. As an example, the first source/drain patterns SD1 may be formed of or include a semiconductor material (e.g., Ge) whose lattice constant is larger than a lattice constant of a semiconductor material of the substrate 100.

Each of the second source/drain patterns SD2 may be an epitaxial pattern that is grown using the first to third semiconductor patterns SP1, SP2, and SP3 of the second channel pattern CH2 and the second active pattern AP2 as a seed layer. The second source/drain pattern SD2 may be formed of or include a semiconductor material different from the first source/drain pattern SD1. The second source/drain patterns SD2 may include n-type impurities. The second source/drain patterns SD2 may be formed of or include a semiconductor material whose lattice constant is smaller than that of the semiconductor material of the substrate 100. In addition, the second source/drain patterns SD2 may be formed of or include the semiconductor material (e.g., Si) as that of the substrate 100. Although not shown, when viewed in a first direction D1, the second source/drain patterns SD2 may have a sectional shape different from that of the first source/drain patterns SD1. For example, when viewed in the first direction D1, the second source/drain patterns SD2 may have a rounded shape, compared with the first source/drain patterns SD1.

Gate electrodes GE may be provided to cross the first and second channel patterns CH1 and CH2 and to extend in the first direction D1. The gate electrodes GE may be spaced apart from each other in the second direction D2. The gate electrodes GE may be overlapped with the first and second channel patterns CH1 and CH2, when viewed in a plan view. The gate electrode GE may be formed of or include, for example, at least one of conductive metal nitrides (e.g., titanium nitride and tantalum nitride) or metallic materials (e.g., titanium, tantalum, tungsten, copper, and aluminum).

The gate electrode GE may surround each of the first to third semiconductor patterns SP1, SP2, and SP3 of the first channel pattern CH1. For example, the gate electrode GE may be provided to face a top surface, a bottom surface, and opposite side surfaces of each of the first to third semiconductor patterns SP1, SP2, and SP3. The gate electrode GE may also surround the first to third semiconductor patterns SP1, SP2, and SP3 of the second channel pattern CH2. Thus, the first and second transistors according to an example embodiment may be gate-all-around type field effect transistors.

A pair of gate spacers GS may be disposed on opposite side surfaces of each of the gate electrodes GE. The gate spacers GS may be extended along the gate electrode GE and in the first direction D1. The gate spacers GS may have top surfaces that are higher than a top surface of the gate electrode GE. The top surfaces of the gate spacers GS may be coplanar with a top surface of a first interlayer insulating layer 110, which will be described below. The gate spacers GS may be formed of or include at least one of SiCN, SiCON, or SiN. In another example, the gate spacers GS may be a multi-layered structure that includes at least two layers formed of at least two of SiCN, SiCON, or SiN. In an example embodiment, the gate spacers GS may be formed of or include at least one of low-k dielectric materials. Although not shown, an air gap may be formed in at least one of the gate spacers GS.

Gate dielectric patterns GI may be respectively interposed between the gate electrodes GE and the first and second channel patterns CH1 and CH2. The gate dielectric pattern GI may be provided to surround each of the first to third semiconductor patterns SP1, SP2, and SP3. The gate dielectric pattern GI may be interposed between the gate electrode GE and each of the first to third semiconductor patterns SP1, SP2, and SP3. The gate dielectric pattern GI may be formed of or include a high-k dielectric material. The high-k dielectric materials may include, for example, at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

A blocking insulating layer BP may be formed between the side surface of the gate electrode GE and the first and second source/drain patterns SD1 and SD2. The blocking insulating layer BP may be formed between top and bottom surfaces of the first to third semiconductor patterns SP1, SP2, and SP3. The blocking insulating layer BP may electrically disconnect the gate electrode GE from the first and second source/drain patterns SD1 and SD2.

A gate capping pattern CP may be provided on each of the gate electrodes GE. The gate capping pattern CP may be extended along the gate electrode GE and in the first direction D1. The gate capping pattern CP may be formed of or include a material that is selected to have an etch selectivity with respect to the first interlayer insulating layer 110, which will be described below. For example, the gate capping patterns CP may be formed of or include at least one of SiON, SiCN, SiCON, or SiN.

Interlayer insulating layers 110, 120, and 130 may be provided on the substrate 100 to cover the device isolation layer ST, the gate electrodes GE, and the first and second source/drain patterns SD1 and SD2. The interlayer insulating layers 110, 120, and 130 may include a first interlayer insulating layer 110, a second interlayer insulating layer 120, and a third interlayer insulating layer 130, which are sequentially stacked on the substrate 100. The first interlayer insulating layer 110 may cover the device isolation layer ST, the gate dielectric pattern GI, and the first and second source/drain patterns SD1 and SD2. The first interlayer insulating layer 110 may have a top surface that is substantially coplanar with top surfaces of the gate capping patterns CP.

The second interlayer insulating layer 120 may be provided on the first interlayer insulating layer 110. The second interlayer insulating layer 120 may cover the top surface of the first interlayer insulating layer 110, the top surfaces of the gate capping patterns CP, and the top surface of the gate spacer GS. The top surface of the first interlayer insulating layer 110, the top surfaces of the gate capping patterns CP, and the top surface of the gate spacer GS may be substantially coplanar with each other, and thus, the second interlayer insulating layer 120 may have a bottom surface positioned at a constant vertical level.

The third interlayer insulating layer 130 may be provided on the second interlayer insulating layer 120. The third interlayer insulating layer 130 may cover a top surface of the second interlayer insulating layer 120. As shown in FIG. 2A, a portion of the third interlayer insulating layer 130 may be extended toward the first and second source/drain patterns SD1 and SD2 to cover inner side surfaces of the first and second interlayer insulating layers 110 and 120. Each of the first to third interlayer insulating layers 110, 120, and 130 may include, for example, a silicon oxide layer or a silicon oxynitride layer.

In an example embodiment, the first to third interlayer insulating layers 110, 120, and 130 may be provided as a single element, that is, without an interface therebetween.

First and second contact plugs CT1 and CT2 may be provided to penetrate the interlayer insulating layers 110, 120, and 130, and may be electrically connected to the first and second source/drain patterns SD1 and SD2, respectively. For example, the first and second contact plugs CT1 and CT2 may penetrate the second and third interlayer insulating layers 120 and 130, and may be placed between opposite inner side surfaces of the first interlayer insulating layer 110.

The first and second contact plugs CT1 and CT2 may be extended toward the substrate 100, and may be inserted into the first and second source/drain patterns SD1 and SD2, respectively. The first contact plug CT1 may include a first portion P1, which is buried in the first source/drain pattern SD1, and a second portion P2, which is provided to penetrate the interlayer insulating layers 110, 120, and 130 and is connected to the first portion P1. The second contact plug CT2 may include a third portion P3, which is buried in the second source/drain pattern SD2, and a fourth portion P4, which is provided to penetrate the interlayer insulating layers 110, 120, and 130 and is connected to the third portion P3.

A first interface layer SC1 may be provided between the first portion P1 and the first source/drain pattern SD1. The first contact plug CT1 may be spaced apart from the first source/drain pattern SD1 with the first interface layer SC1 interposed therebetween. A second interface layer SC2 may be provided between the third portion P3 and the second source/drain pattern SD2. The second contact plug CT2 may be spaced apart from the second source/drain pattern SD2 with the second interface layer SC2 interposed therebetween.

The first portion P1 and the first interface layer SC1 may be in direct contact with each other. In addition, the third portion P3 and the second interface layer SC2 may be in direct contact with each other. Thus, a barrier layer may not be formed between the first portion P1 and the first interface layer SC1 and between the third portion P3 and the second interface layer SC2. The first and second interface layers SC1 and SC2 may be formed of or include metal silicide. For example, the first and second interface layers SC1 and SC2 may be silicide layers that are formed during the formation of the first and second contact plugs CT1 and CT2. The first and second interface layers SC1 and SC2 may include different metallic elements from each other. The first interface layer SC1 may include one of, for example, nickel (Ni), platinum (Pt), rhodium Rh, iridium (Ir), molybdenum (Mo), or combinations thereof. The second interface layer SC2 may include one of, for example, titanium (Ti), tantalum (Ta), or combinations thereof.

The first interface layer SC1 may be formed to conformally cover an inner side surface of a first recess region RS1, which is formed in an upper portion of the first source/drain patterns SD1. The second interface layer SC2 may be formed to conformally cover an inner side surface of a second recess region RS2, which is formed in an upper portion of the second source/drain patterns SD2. A bottom portion SC1b of the first interface layer SC1 and a bottom portion SC2b of the second interface layer SC2 may be positioned at a level that is lower than the bottom surface of the third semiconductor pattern SP3. The third semiconductor pattern SP3 may be the topmost one of the semiconductor patterns constituting each of the first and second channel patterns CH1 and CH2.

Figure 3A:
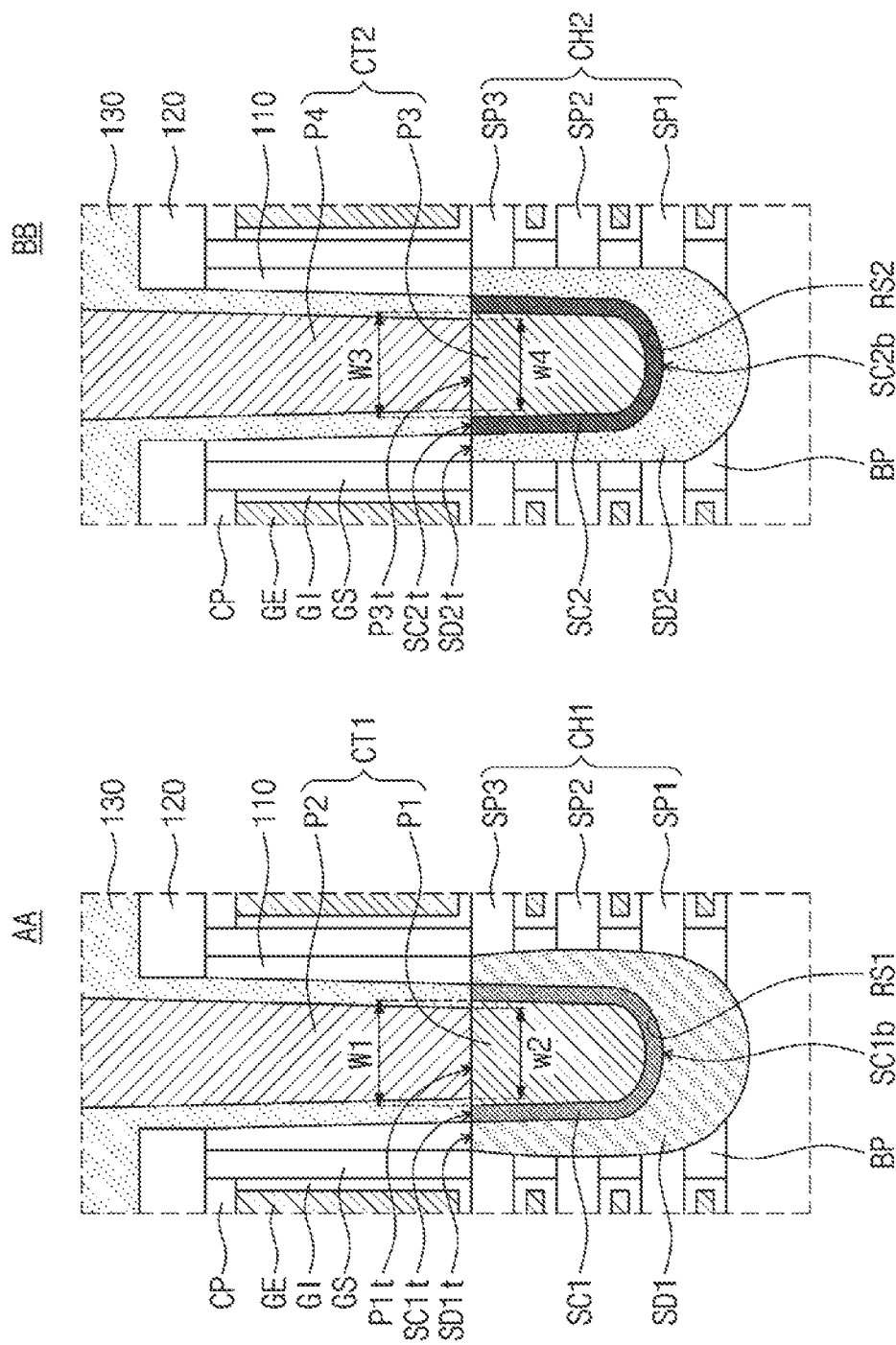
FIGS. 3A and 3B illustrate enlarged sectional views of portions 'AA' and 'BB' of FIG. 2A.
Figure 3B:
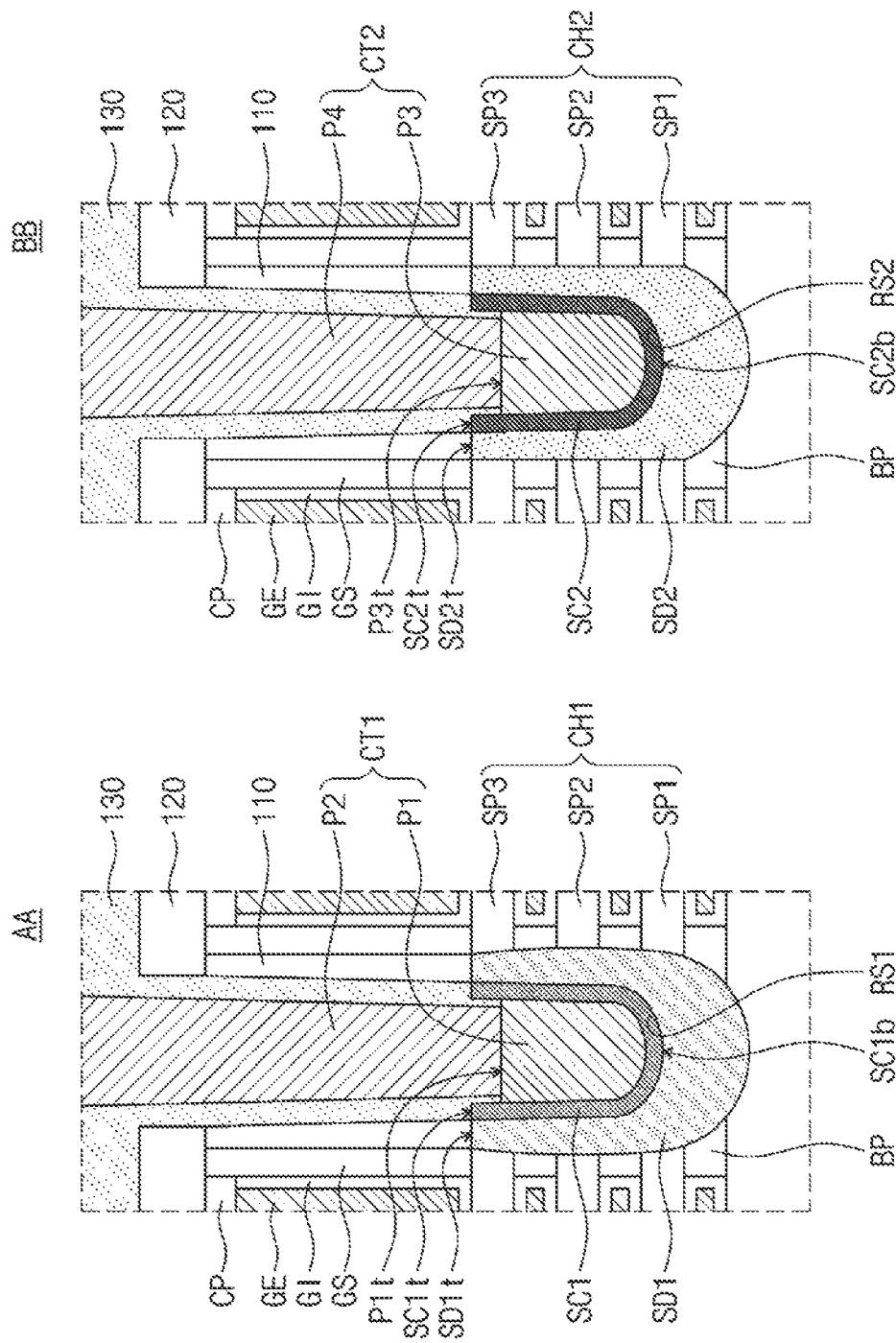

FIGS. 3A and 3B are enlarged sectional views of portions 'AA' and 'BB' of FIG. 2A.

Hereinafter, examples of the first and second source/drain patterns SD1 and SD2, the first and second interface layers SC1 and SC2, and the first and second contact plugs CT1 and CT2 will be described in more detail with reference to FIGS. 3A and 3B.

Referring to FIGS. 3A and 3B, a top portion SD1t of the first source/drain pattern SD1 may be positioned at substantially the same level as a top portion SC1t of the first interface layer SC1. The first interface layer SC1 may fill a portion of the first recess region RS1, which is recessed from the top portion SD1t of the first source/drain pattern SD1 in a downward direction. The first interface layer SC1 may conformally cover the inner side surface of the first recess region RS1 (that is, with a constant thickness). The bottom portion SC1b of the first interface layer SC1 may be positioned at a level that is higher than the bottom surface of the first semiconductor pattern SP1. The first semiconductor pattern SP1 may be the bottommost one of the semiconductor patterns constituting each of the first and second channel patterns CH1 and CH2.

The first portion P1 of the first contact plug CT1 may fill a remaining region of the first recess region RS1. A barrier layer, such as a metal nitride layer, may not be interposed between the first portion P1 and the first interface layer SC1. For example, the first portion P1 may be in direct contact with an inner side surface of the first interface layer SC1.

A width of the first portion P1 measured in the second direction D2 may increase with increasing distance from the substrate 100 (e.g., see FIG. 2A). For example, the first portion P1 may have the largest width W1 at a level of a top surface P1t thereof, when measured in the second direction D2.

The top surface P1t of the first portion P1 may be positioned at a level that is not higher than the top portion SD1t of the first source/drain pattern SD1. As an example, the top surface P1t of the first portion P1 may be positioned at substantially the same level as the top portion SD1t of the first source/drain pattern SD1, as shown in FIG. 3A.

As another example, the top surface P1t of the first portion P1 may be positioned at a level that is lower than the top portion SD1t of the first source/drain pattern SD1 and is higher than the bottom surface of the third semiconductor pattern SP3, as shown in FIG. 3B.

A width of the second portion P2 of the first contact plug CT1 measured in the second direction D2 may decrease with decreasing distance from the top surface P1t of the first portion P1. Thus, the second portion P2 may have the smallest width W2 at a level of a bottom surface thereof, when measured in the second direction D2. The width W2 of the bottom surface of the second portion P2 may be smaller than the width W1 of the top surface P1t of the first portion P1. Accordingly, a portion of the top surface P1*t* of the first portion P1 may be covered with at least one of the interlayer insulating layers 110, 120, and 130.

The second portion P2 may be in direct contact with the third interlayer insulating layer 130. An interface between the second portion P2 and the third interlayer insulating layer 130 will be described in more detail with reference to FIG. 5.

A top portion SD2*t* of the second source/drain pattern SD2 may be positioned at substantially the same level as a top portion SC2*t* of the second interface layer SC2. The second interface layer SC2 may fill a portion of the second recess region RS2, which is recessed from the top portion SD2*t* of the second source/drain pattern SD2 in a downward direction. The second interface layer SC2 may conformally cover the inner side surface of the second recess region RS2 (that is, with a constant thickness). The bottom portion SC2*b* of the second interface layer SC2 may be positioned at a level that is higher than the bottom surface of the first semiconductor pattern SP1.

The third portion P3 of the second contact plug CT2 may fill a remaining region of the second recess region RS2. A barrier layer, such as a metal nitride layer, may not be interposed between the third portion P3 and the second interface layer SC2. For example, the third portion P3 may be in direct contact with an inner side surface of the second interface layer SC2.

A width of the third portion P3 measured in the second direction D2 may increase with increasing distance from the substrate 100 (e.g., see FIG. 2A). For example, the third portion P3 may have the largest width W3 at a level of a top surface P3*t* thereof, when measured in the second direction D2.

The top surface P3*t* of the third portion P3 may be positioned at a level that is not higher than the top portion SD2*t* of the second source/drain pattern SD2. As an example, the top surface P3*t* of the third portion P3 may be positioned at substantially the same level as the top portion SD2*t* of the second source/drain pattern SD2, as shown in FIG. 3A.

As another example, the top surface P3*t* of the third portion P3 may be positioned at a level that is lower than the top portion SD2*t* of the second source/drain pattern SD2 and is higher than the bottom surface of the third semiconductor pattern SP3, as shown in FIG. 3B.

A width of the fourth portion P4 of the second contact plug CT2 measured in the second direction D2 may decrease with decreasing distance from the top surface P3*t* of the third portion P3. For example, the fourth portion P4 may have the smallest width W4 at a level of a bottom surface thereof, when measured in the second direction D2. The width W4 of the bottom surface of the fourth portion P4 may be smaller than the width W3 of the top surface P3*t* of the third portion P3. Accordingly, a portion of the top surface P3*t* of the third portion P3 may be covered with at least one of the interlayer insulating layers 110, 120, and 130.

The fourth portion P4 may be in direct contact with the third interlayer insulating layer 130. An interface between the fourth portion P4 and the third interlayer insulating layer 130 will be described in more detail when an interface between the second portion P2 and the third interlayer insulating layer 130 will be described below.

Figure 4:
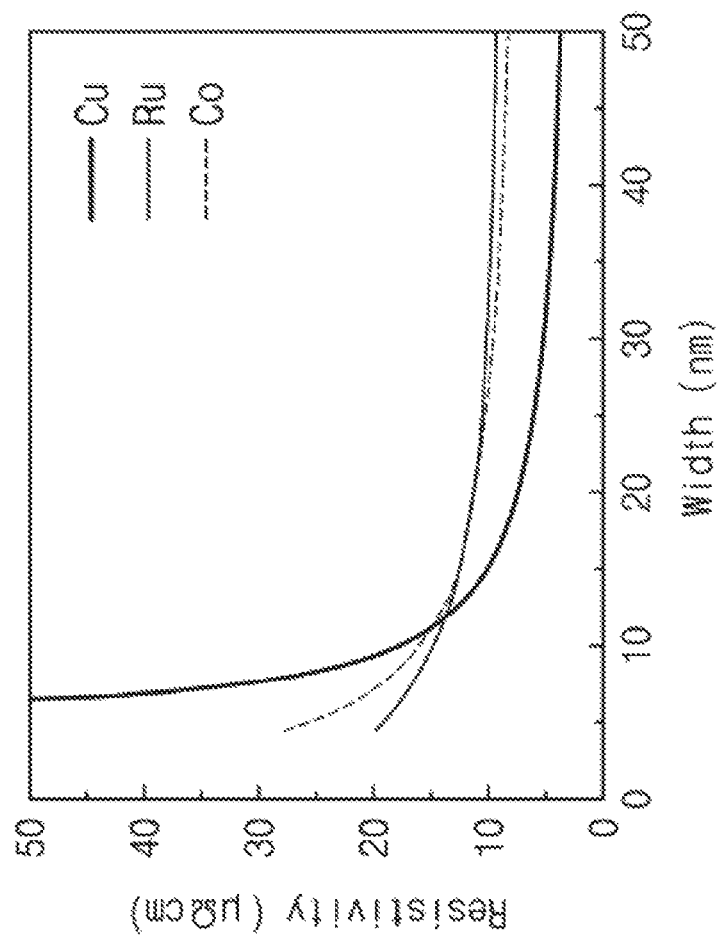
FIG. 4 illustrates a graph showing resistivity versus linewidth, for different materials of a contact plug.

FIG. 4 is a graph showing resistivity versus linewidth for different materials of a contact plug.

The first and second contact plugs CT1 and CT2 may be formed to have a small electron mean free path (eMFP). For example, the first and second contact plugs CT1 and CT2 may be formed of or include at least one of ruthenium (Ru), iridium (Ir), rhodium Rh, molybdenum (Mo), platinum (Pt), tungsten (W), or alloys thereof.

The first and second contact plugs CT1 and CT2 may be formed to have an electron mean free path (eMFP) of 11 nm or shorter at room temperature and normal pressure. FIG. 4 shows that, when a linewidth of a contact plug is reduced to be less than a specific width, resistivity values of materials may be reversed. For example, copper (Cu), cobalt (Co), and ruthenium (Ru) at room temperature and normal pressure had the eMFP values of 39 nm, 11.8 nm, and 6.6 nm, respectively. When the linewidth was less than about 11 nm, a contact plug made of cobalt had resistivity that is lower than a contact plug made of copper. In addition, when the linewidth was smaller than or equal to about 16 nm, a contact plug made of ruthenium had resistivity that is lower than a contact plug made of cobalt. Referring back to FIG. 3A, when the first and second contact plugs CT1 and CT2 include ruthenium (Ru), it may be possible to prevent a conductive material in the first and second contact plugs CT1 and CT2 from being diffused into the third interlayer insulating layer 130.

Figure 5:
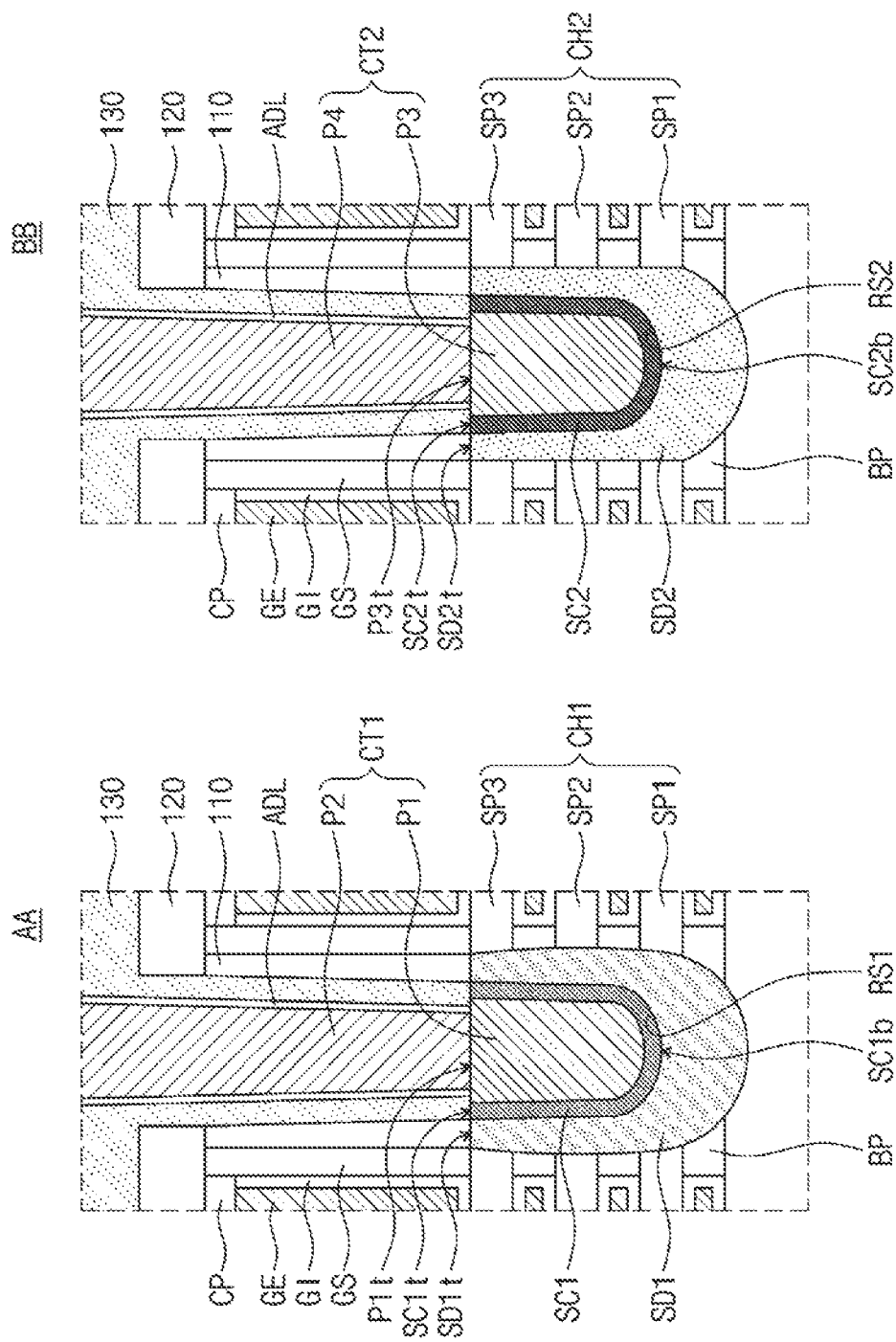
FIG. 5 illustrates an enlarged sectional view illustrating portions of a semiconductor device, which correspond to the portions 'AA' and 'BB' of FIG. 2A, according to an example embodiment.

FIG. 5 is an enlarged sectional view illustrating portions of a semiconductor device, which correspond to the portions 'AA' and 'BB' of FIG. 2A, according to an example embodiment.

Referring to FIG. 5, a spacer ADL may be interposed between the second portion P2 of the first contact plug CT1 and the third interlayer insulating layer 130, and between the fourth portion P4 of the second contact plug CT2 and the third interlayer insulating layer 130. The spacer ADL may be formed of or include at least one of, for example, AlOx, SiO, SiN, TiOx, RuOx, SiOCN, AN, SiOC, CoOx, or combinations thereof. In an example embodiment, the spacer ADL may include a metal oxide.

As an example, the metal oxide may be an interfacial layer that is formed between the first and second contact plugs CT1 and CT2 and the third interlayer insulating layer 130, when the first and second contact plugs CT1 and CT2 are directly formed on the third interlayer insulating layer 130. In this case, the metal oxide may include the same element as that in the first and second contact plugs CT1 and CT2. For example, in the case where the first and second contact plugs CT1 and CT2 include ruthenium (Ru), the metal oxide may include ruthenium oxide (RuOx).

As another example, the metal oxide may be a layer that is deposited on the third interlayer insulating layer 130 before the formation of the first and second contact plugs CT1 and CT2. For example, the metal oxide may include AlOx, TiOx, RuOx, or TaOx. In an example embodiment, in the case where the first and second contact plugs CT1 and CT2 include ruthenium (Ru), the metal oxide may include tantalum oxide (TaOx).

The spacer ADL may cover a side surface of the second portion P2 of the first contact plug CT1 and a side surface of the fourth portion P4 of the second contact plug CT2. In an example embodiment, the spacer ADL may not cover a bottom surface of the second portion P2 of the first contact plug CT1 and a bottom surface of the fourth portion P4 of the second contact plug CT2. The bottom portion of the spacer ADL may be positioned at the same level as the bottom surfaces of the second and fourth portions P2 and P4. The bottom portion of the spacer ADL may be in contact with the top surfaces of the first and third portions P1 and P3.

As another example, in the case where the first and second contact plugs CT1 and CT2 include molybdenum (Mo) or tungsten (W), the spacer ADL may be omitted, as shown in FIG. 3B. In the case where the first and second contact plugs CT1 and CT2 include molybdenum (Mo) or tungsten (W), the first and second contact plugs CT1 and CT2 may be in direct contact with the third interlayer insulating layer 130.

Figure 6A:
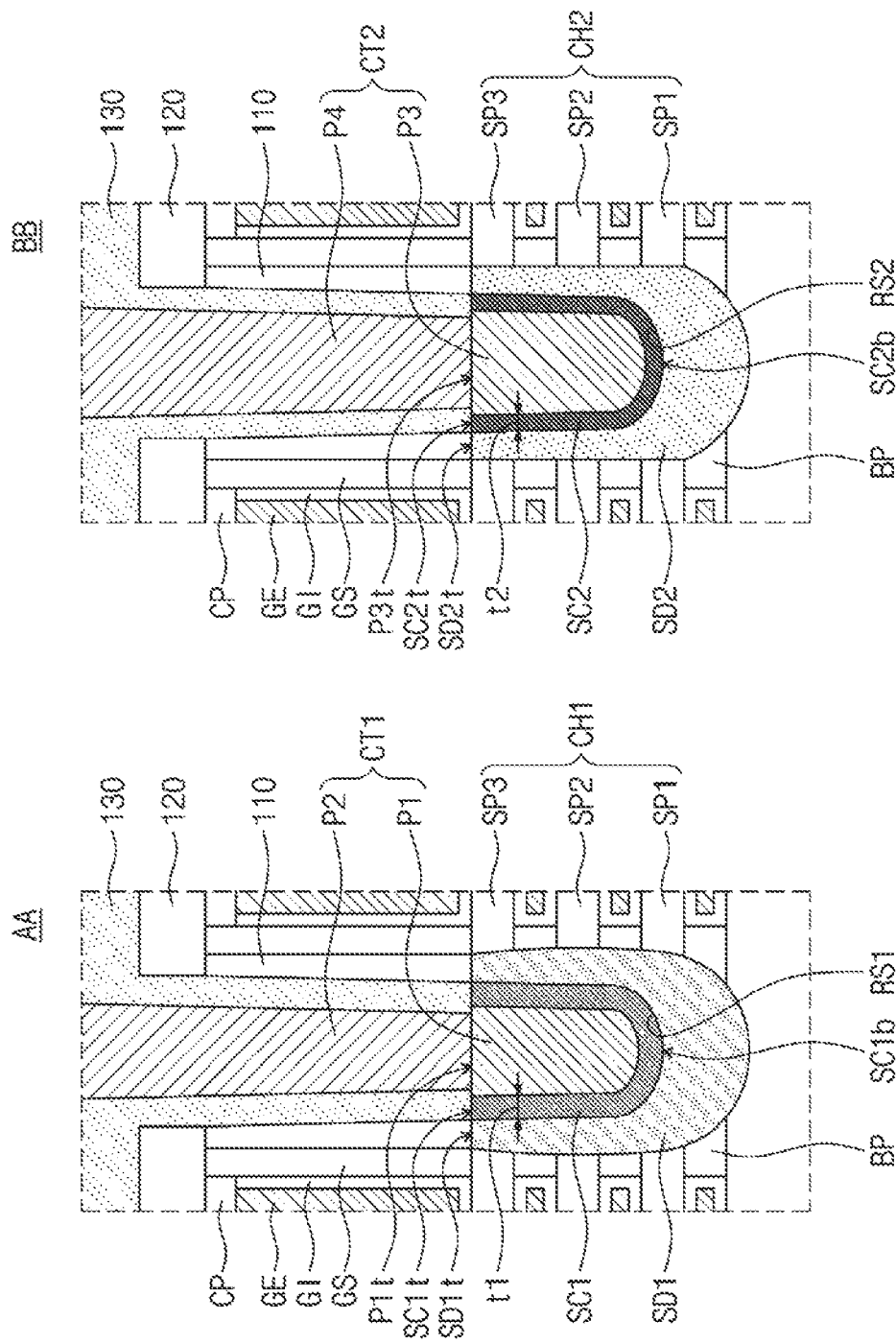
FIGS. 6A and 6B illustrate enlarged sectional views each illustrating portions of a semiconductor device, which correspond to the portions 'AA' and 'BB' of FIG. 2A, according to an example embodiment.
Figure 6B:
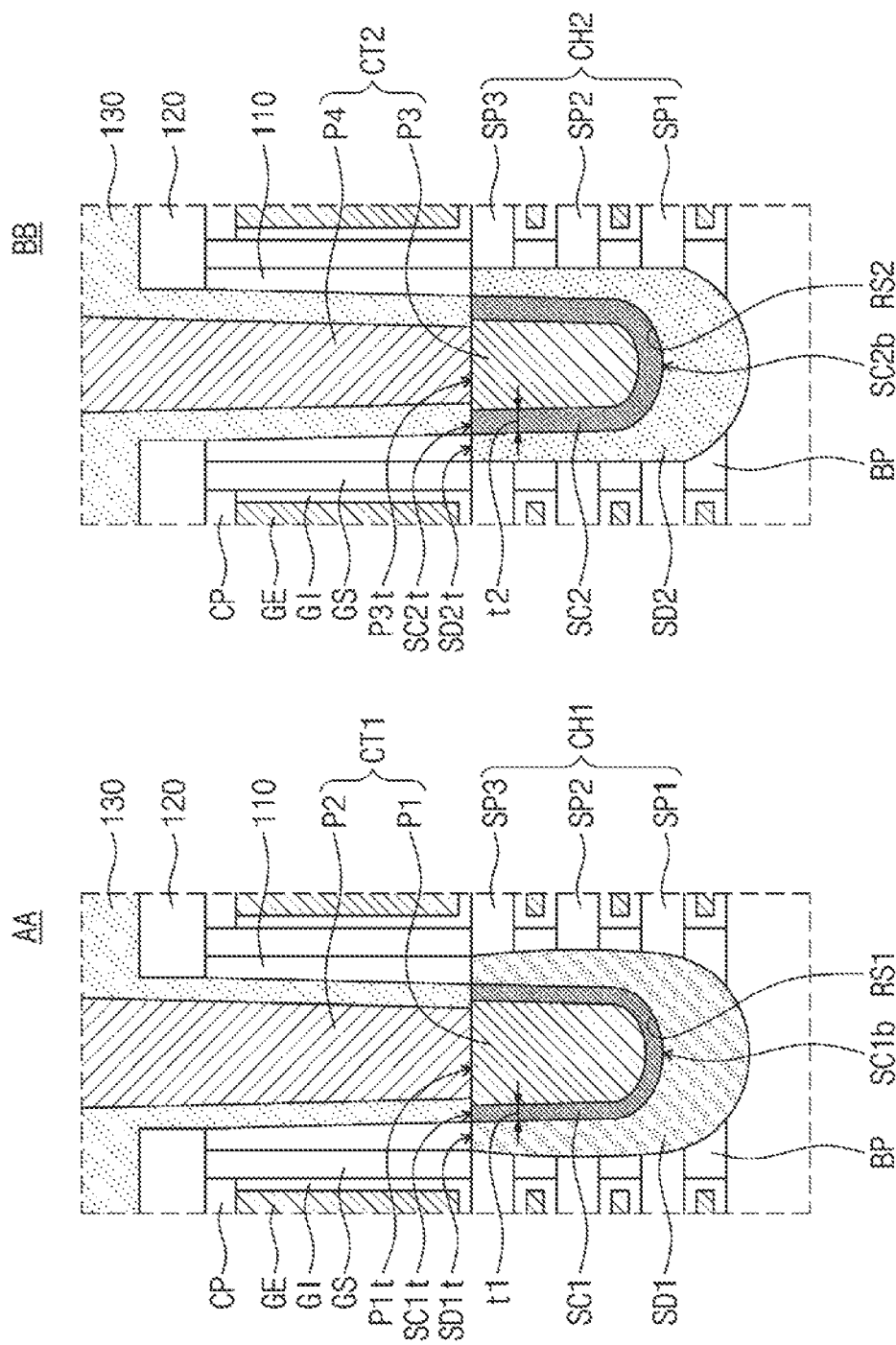
Figure 7A:
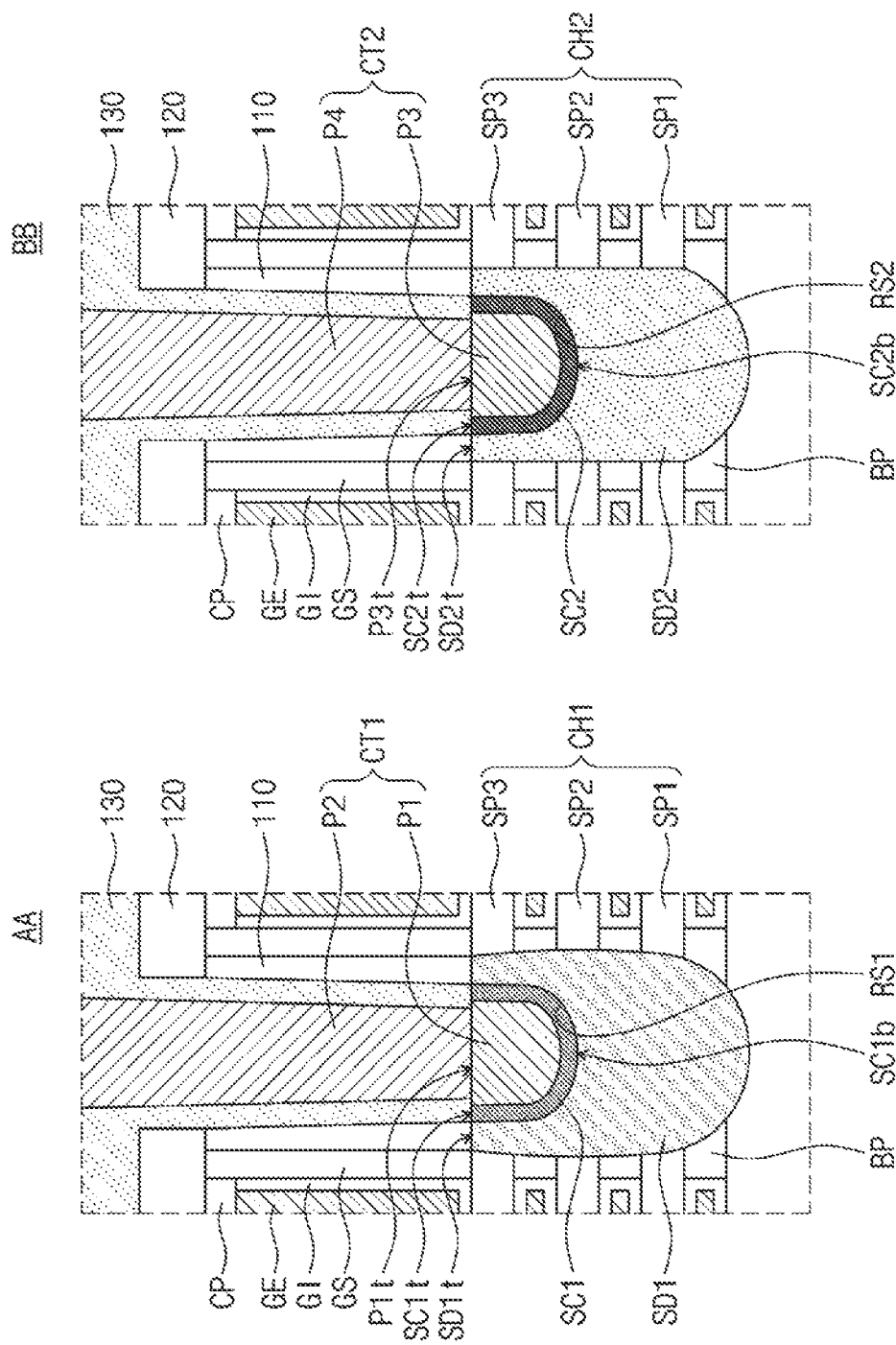
FIGS. 7A to 7C illustrate enlarged sectional views each illustrating portions of a semiconductor device, which correspond to the portions 'AA' and 'BB' of FIG. 2A, according to an example embodiment.
Figure 7B:
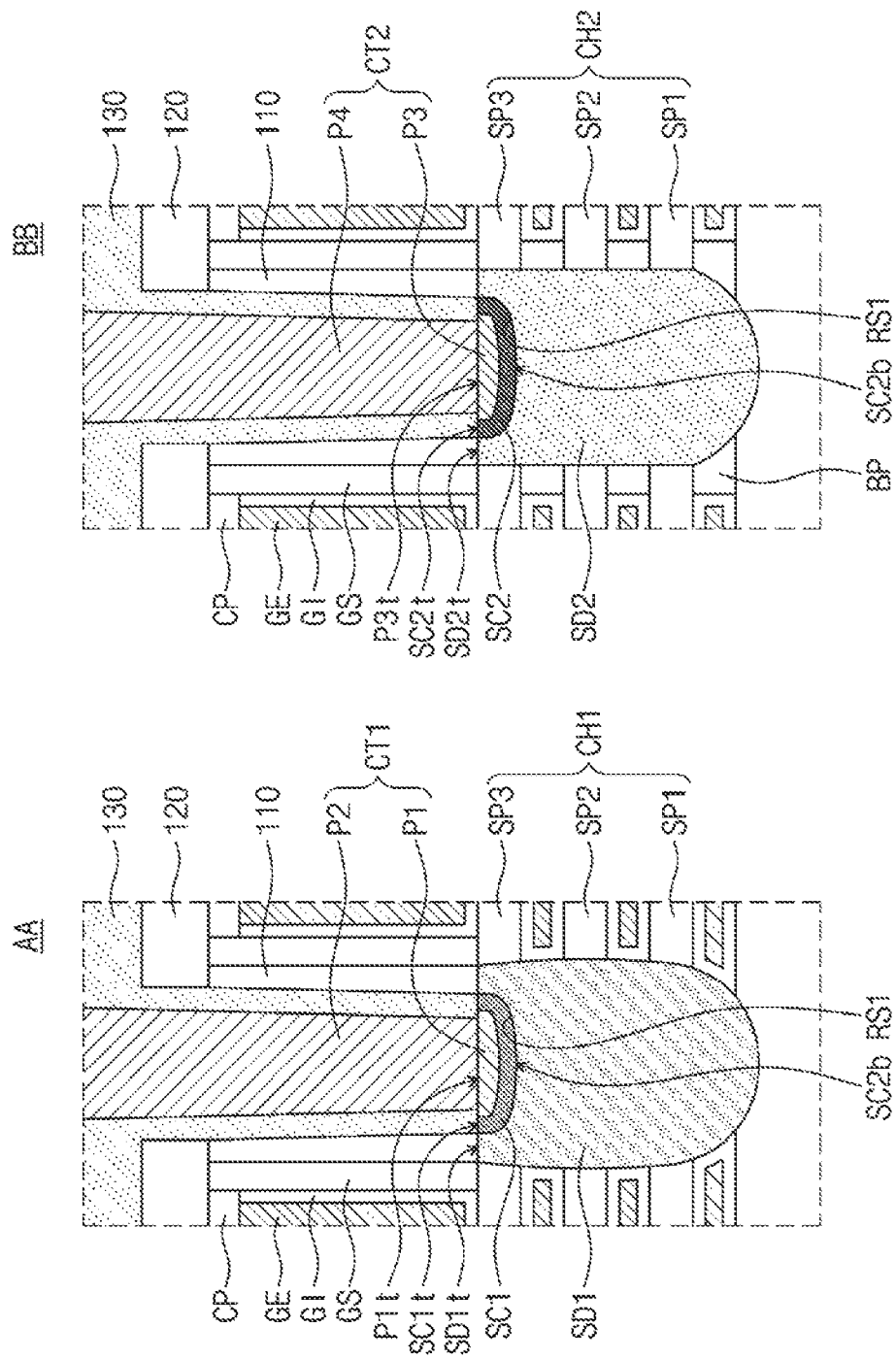
Figure 7C:
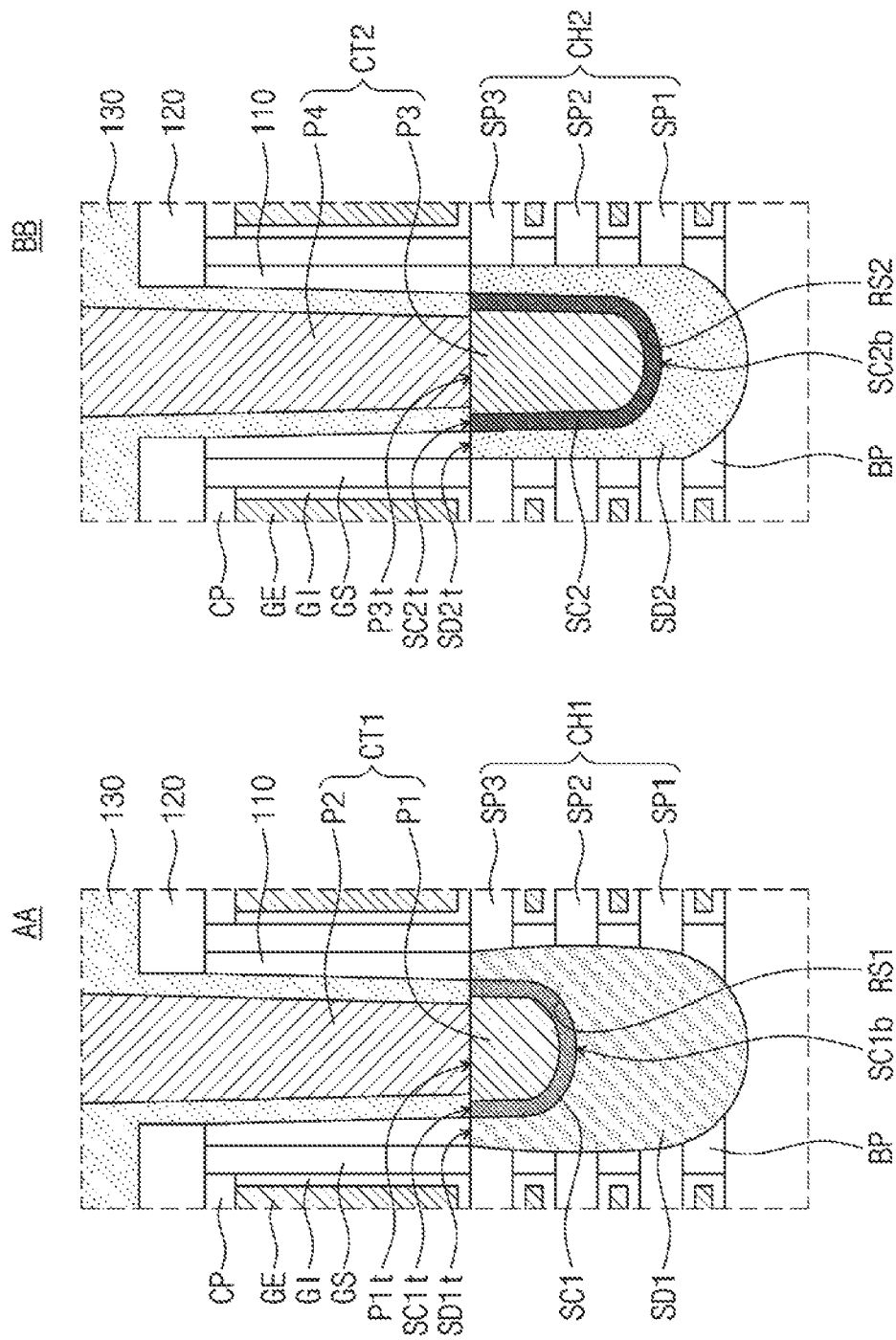
Figure 8:
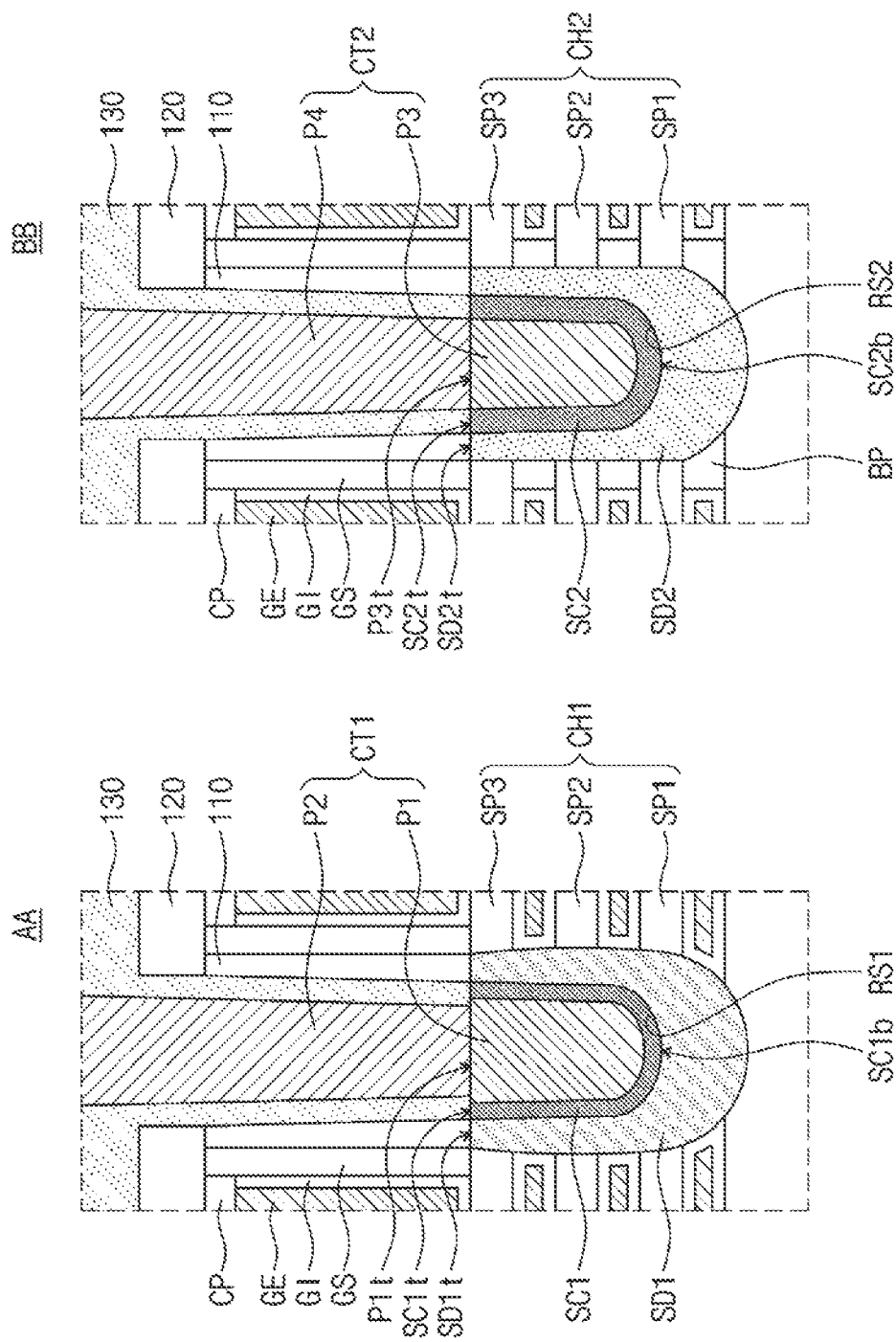
FIGS. 8 and 9 illustrate enlarged sectional views each illustrating portions of a semiconductor device, which correspond to the portions 'AA' and 'BB' of FIG. 2A, according to an example embodiment.
Figure 9:
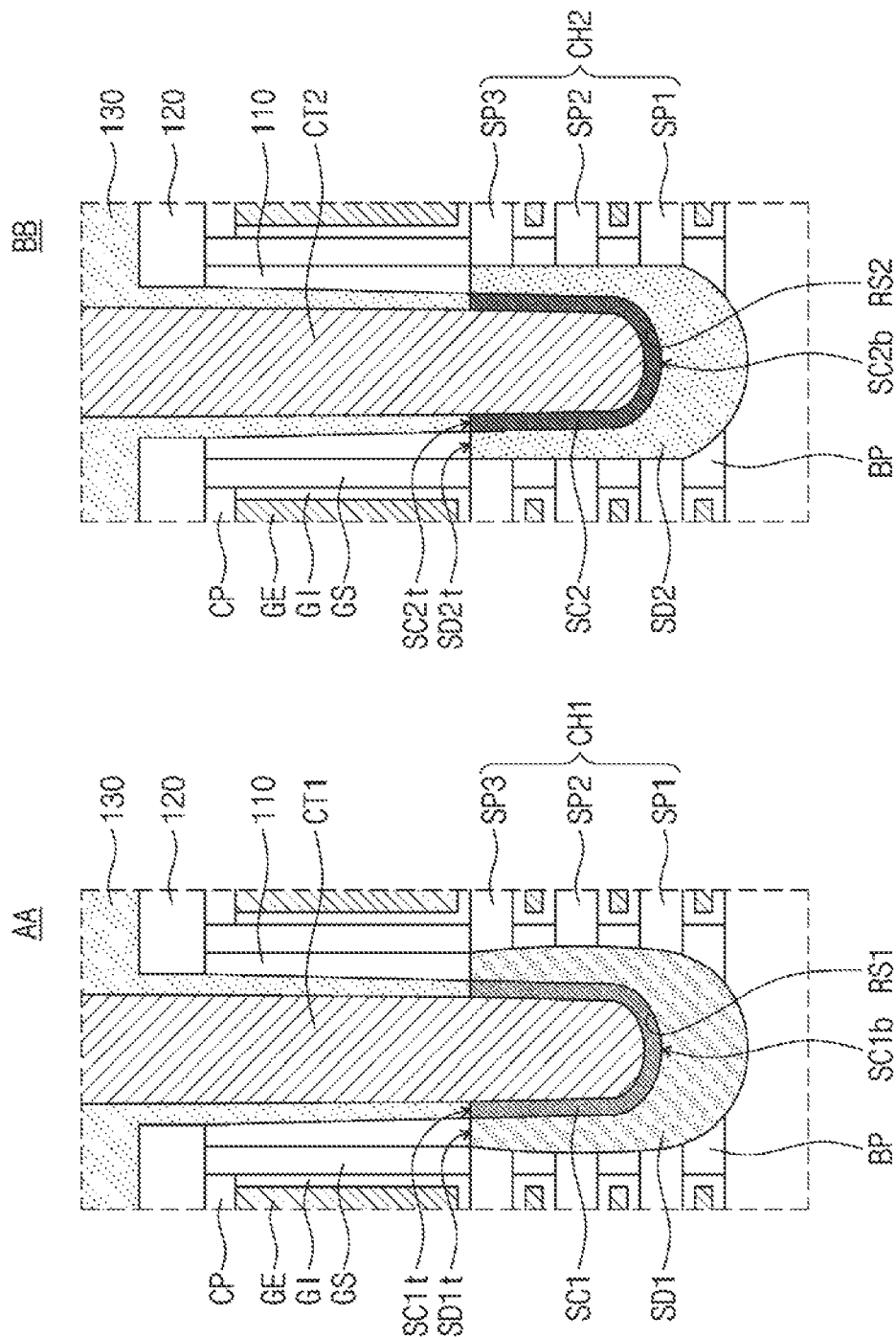

FIGS. 6A and 6B are enlarged sectional views each illustrating portions of a semiconductor device, which correspond to the portions 'AA' and 'BB' of FIG. 2A, according to an example embodiment. FIGS. 7A to 7C are enlarged sectional views each illustrating portions of a semiconductor device, which correspond to the portions 'AA' and 'BB' of FIG. 2A, according to an example embodiment. FIGS. 8 and 9 are enlarged sectional views each illustrating portions of a semiconductor device, which correspond to the portions 'AA' and 'BB' of FIG. 2A, according to an example embodiment. For brevity, the elements and features of this example that are similar to those previously shown and described will not be described in much further detail.

Referring to FIGS. 6A and 6B, the first and second interface layers SC1 and SC2 may have different thicknesses from each other. In an example embodiment, as shown in FIG. 6A, a thickness t1 of the first interface layer SC1 may be greater than a thickness t2 of the second interface layer SC2. Here, the first region RG1, on which the first interface layer SC1 is disposed, may be a PMOSFET region, and the first interface layer SC1 may include a metallic element different from that in the second interface layer SC2.

In an example embodiment, the thickness t1 of the first interface layer SC1 may be smaller than the thickness t2 of the second interface layer SC2, as shown in FIG. 6B. Here, the second region RG2, on which the second interface layer SC2 is provided, may be an NMOSFET region, and the first and second interface layers SC1 and SC2 may include the same metallic element. In an example embodiment, the first and second interface layers SC1 and SC2 may be formed of or include at least one of, for example, titanium silicide (TiSi), tungsten silicide (WSi), cobalt silicide (CoSi), nickel silicide (NiSi), molybdenum silicide (MoSi), or tantalum silicide (TaSi).

Referring to FIGS. 7A and 7B, each of the first and second source/drain patterns SD1 and SD2 may be provided such that a bottom portion thereof is thicker than a sidewall portion thereof. The bottom portion SC1$b$ of the first interface layer SC1 and the bottom portion SC2$b$ of the second interface layer SC2 may be positioned at a vertical level that is higher than the bottom surface of the second semiconductor pattern SP2, as shown in FIG. 7A. The second semiconductor pattern SP2 may be the second topmost one of the semiconductor patterns constituting each of the channel patterns CH1 and CH2.

As shown in FIG. 7B, the bottom portion SC1$b$ of the first interface layer SC1 and the bottom portion SC2$b$ of the second interface layer SC2 may be positioned at a vertical level that is higher than the bottom surface of the third semiconductor pattern SP3. The third semiconductor pattern SP3 may be the topmost one of the semiconductor patterns constituting each of the channel patterns CH1 and CH2.

Referring to FIG. 7C, the bottom portion SC1$b$ of the first interface layer SC1 and the bottom portion SC2$b$ of the second interface layer SC2 may be positioned at different vertical levels from each other. In an example embodiment, the bottom portion SC2$b$ of the second interface layer SC2 may be positioned at a vertical level lower than the bottom portion SC1$b$ of the first interface layer SC1. The bottom portion of the second contact plug CT2 may be positioned at a vertical level lower than the bottom portion of the first contact plug CT1. The first region RG1, on which the first interface layer SC1 is provided, may be a PMOSFET region, and the second region RG2, on which the second interface layer SC2 is provided, may be an NMOSFET region. A lower portion of the first source/drain pattern SD1 may have a thickness that is greater than that of the second source/drain pattern SD2.

Referring to FIG. 8, the blocking insulating layer BP may be selectively formed on the second region RG2. Thus, the blocking insulating layer BP may not be formed on the first region RG1.

Referring to FIG. 9, the first and second contact plugs CT1 and CT2 may be provided to penetrate the interlayer insulating layers 110, 120, and 130, and may be extended into each of the first and second source/drain patterns SD1 and SD2. In an example embodiment, two portions of the first contact plug CT1, which are respectively disposed in the first source/drain pattern SD1 and the interlayer insulating layers 110, 120, and 130, may be continuously connected to each other, without any interfacial surface therebetween, to form a single element. Similarly, two portions of the second contact plug CT2, which are respectively disposed in the second source/drain pattern SD2 and in the interlayer insulating layers 110, 120, and 130, may be continuously connected to each other, without any interfacial surface therebetween, to form a single element.

In an example embodiment, the first interface layer SC1 may have a surface that is aligned to an inner side surface of the third interlayer insulating layer 130, and the second interface layer SC2 may have a surface that is aligned to an inner side surface of the third interlayer insulating layer 130.

FIGS. 10, 12, 14, and 17 are plan views illustrating a method of fabricating a semiconductor device, according to an example embodiment. FIGS. 11A, 13A, 15A, 16A, 18, 19, 20, and 21 are sectional views taken along lines A1-A1' and A2-A2' of FIGS. 10, 12, 14, 14, 17, 17, 17, and 17, respectively. FIGS. 11B, 13B, 15B, and 16B are sectional views taken along lines B-B' of FIGS. 12, 14, 14, and 14, respectively.

Figure 10:
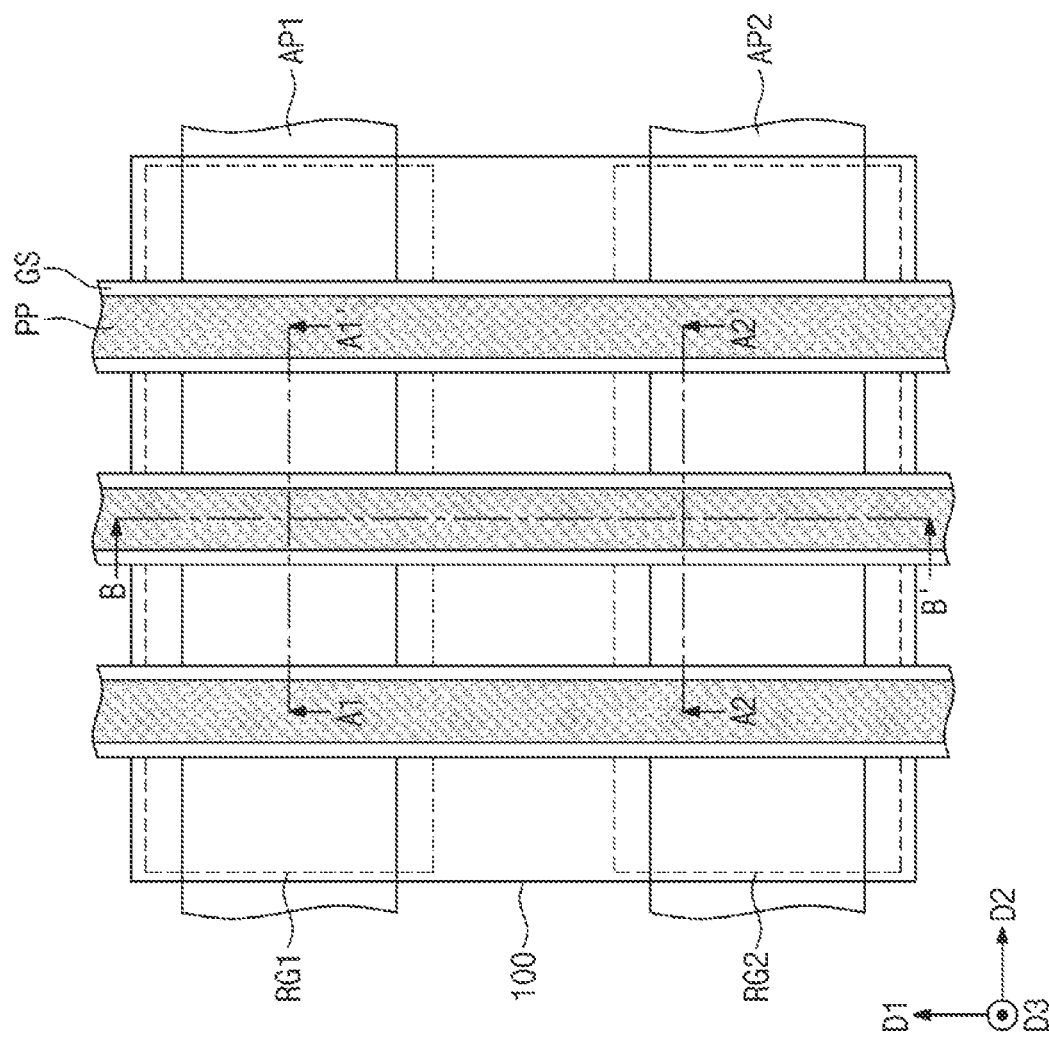
FIGS. 10, 12, 14, and 17 illustrate plan views illustrating a method of fabricating a semiconductor device, according to an example embodiment.
Figure 11A:
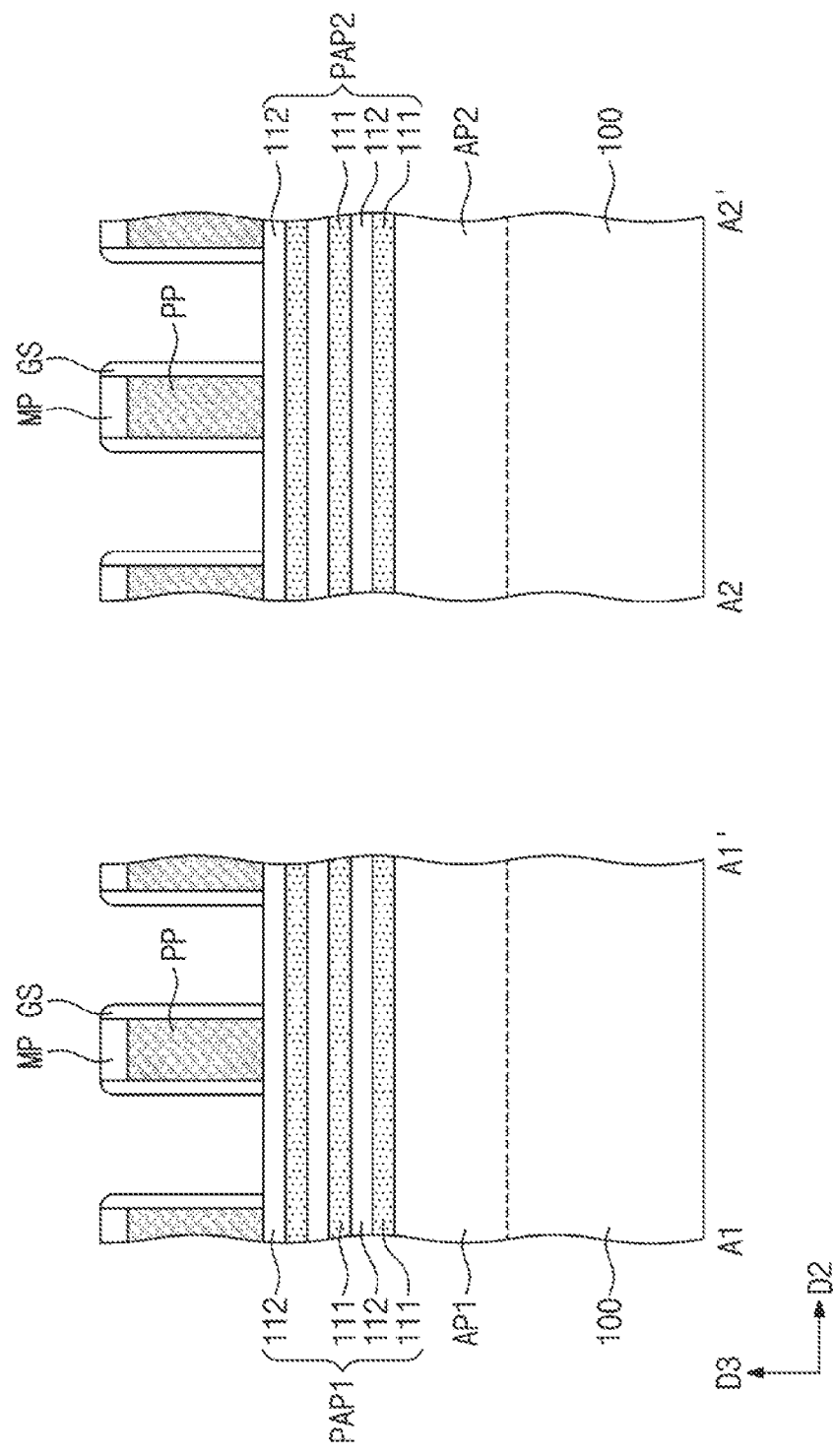
FIGS. 11A, 13A, 15A, 16A, 18, 19, 20, and 21 illustrate sectional views taken along lines A1-A1' and A2-A2' of FIGS. 10, 12, 14, 14, 17, 17, 17, and 17, respectively.

Referring to FIGS. 10, 11A, and 11B, sacrificial layers 111 and semiconductor layers 112 may be alternately and repeatedly stacked on the substrate 100. FIGS. 11A and 11B illustrate an example in which three semiconductor layers 112 are alternately and repeatedly stacked on the substrate 100. The sacrificial layers 111 may be formed of or include a material that is chosen to have an etch selectivity with respect to the semiconductor layers 112. Thus, the semiconductor layers 112 may be formed of or include a material that is not substantially etched during a process of etching the sacrificial layers 111. For example, the sacrificial layers 111 may be formed of or include silicon-germanium (SiGe) or germanium (Ge), and the semiconductor layers 112 may be formed of or include silicon (Si).

Each of the sacrificial and semiconductor layers 111 and 112 may be formed by an epitaxial growth process using the substrate 100 as a seed layer. The sacrificial and semiconductor layers 111 and 112 may be successively formed in the same chamber. The sacrificial layers 111 and the semiconductor layers 112 may be conformally grown on the substrate 100.

Next, the sacrificial layers 111 and the semiconductor layers 112 may be patterned to form first and second preliminary patterns PAP1 and PAP2 on the first and second regions RG1 and RG2, respectively. The patterning process may be performed to etch an upper portion of the substrate 100, and in this case, the first trench TR1 and the second trench TR2 may be formed in the upper portion of the substrate 100. The first trench TR1 may define the first and second active patterns AP1 and AP2. The second trench TR2 may define the first and second regions RG1 and RG2 of the substrate 100.

The first and second preliminary patterns PAP1 and PAP2 may be disposed on the first and second active patterns AP1 and AP2, respectively. The first and second preliminary patterns PAP1 and PAP2 may be overlapped with the first and second active patterns AP1 and AP2, respectively, when viewed in a plan view. The first and second preliminary patterns PAP1 and PAP2 and the first and second active patterns AP1 and AP2 may be line- or bar-shaped patterns extending in the second direction D2.

The device isolation layer ST may be formed to fill the first and second trenches TR1 and TR2. The formation of the device isolation layer ST may include forming an insulating layer on the substrate 100 and recessing the insulating layer to completely expose the first and second preliminary patterns PAP1 and PAP2. The device isolation layer ST may have a top surface that is lower than the top surfaces of the first and second active patterns AP1 and AP2.

Thereafter, sacrificial patterns PP may be formed to cross the first and second preliminary patterns PAP1 and PAP2. The sacrificial patterns PP may be line- or bar-shaped patterns extending in the first direction D1.

The formation of the sacrificial patterns PP may include forming a sacrificial layer on the substrate 100, forming mask patterns MP on the sacrificial layer, and etching the sacrificial layer using the mask patterns MP as an etch mask. The sacrificial layer may be formed of or include polysilicon. The mask patterns MP may be formed of or include at least one of silicon oxide, silicon nitride, or silicon oxynitride.

A pair of the gate spacers GS may be formed on opposite side surfaces of each of the sacrificial patterns PP. The gate spacers GS may be formed of or include at least one of SiCN, SiCON, or SiN. The formation of the gate spacers GS may include forming a spacer layer on the substrate 100 using a deposition process (e.g., CVD or ALD process) and performing an anisotropic etching process on the spacer layer.

Figure 12:
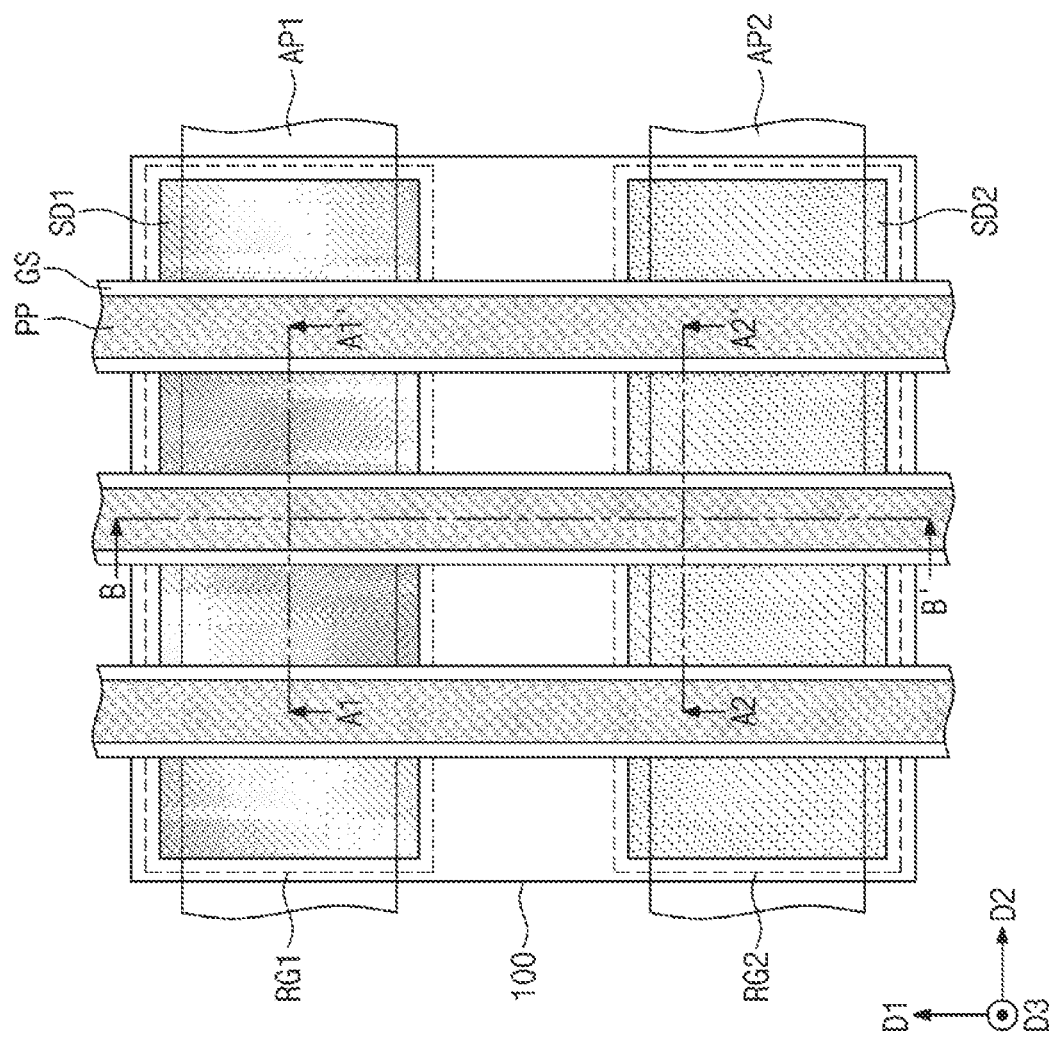
Figure 13A:
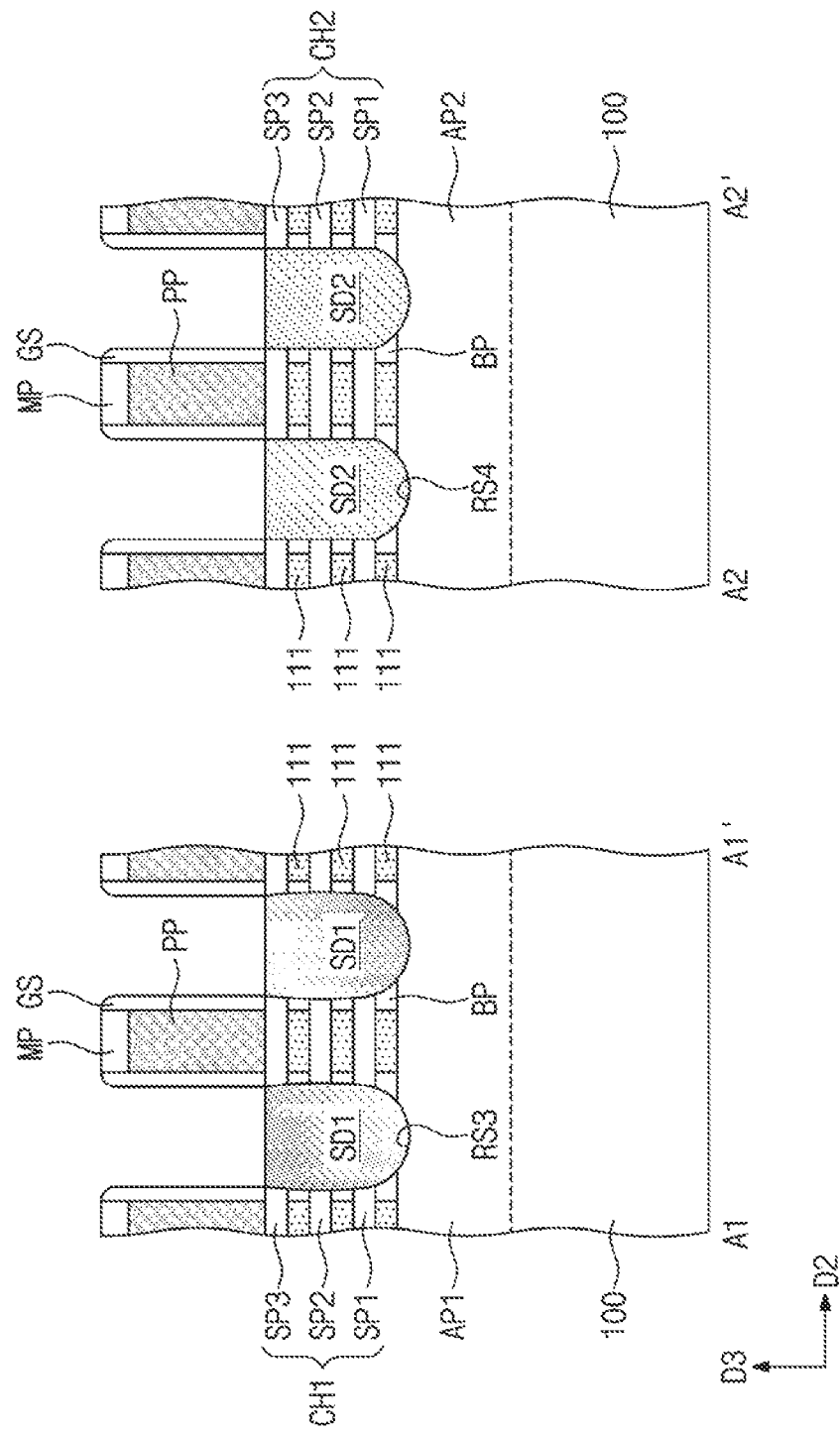
Figure 13B:
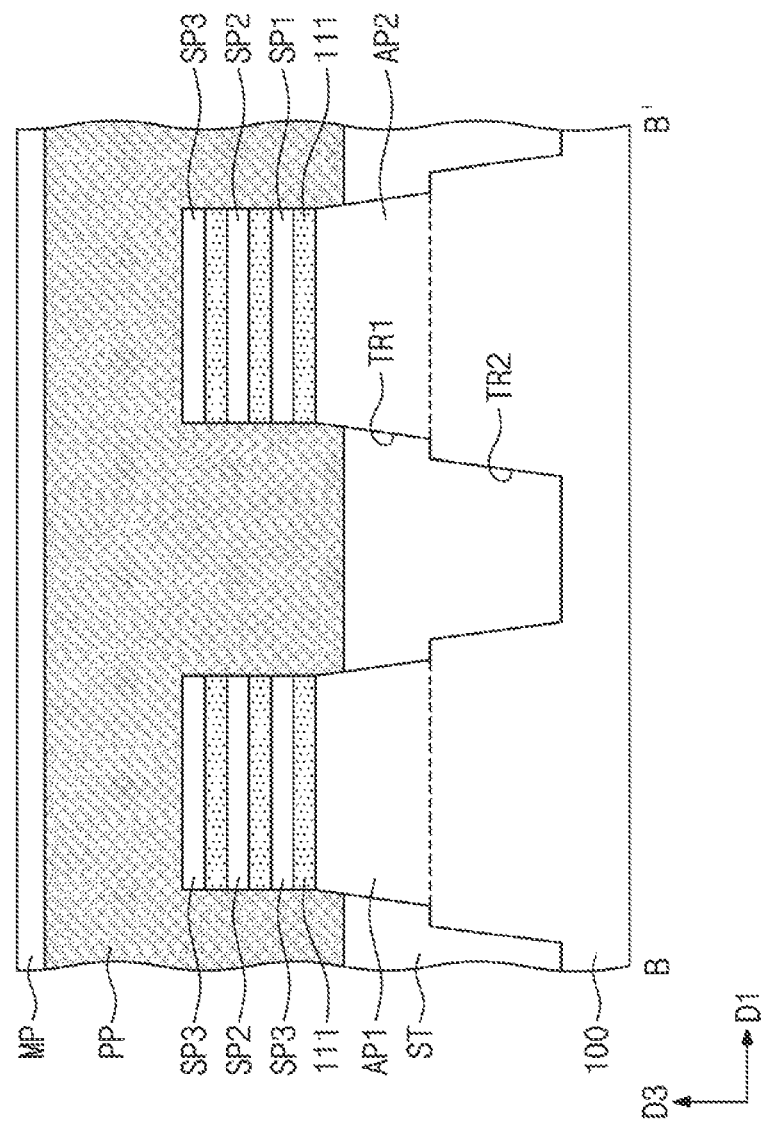

Referring to FIGS. 12, 13A, and 13B, the first and second channel patterns CH1 and CH2 may be formed by partially removing the first and second preliminary patterns PAP1 and PAP2. The formation of the first and second channel patterns CH1 and CH2 may include etching the first and second preliminary patterns PAP1 and PAP2 using the mask patterns MP and the gate spacers GS as an etch mask. In each of the first and second preliminary patterns PAP1 and PAP2, the semiconductor layers 112 may be patterned to form the first to third semiconductor patterns SP1, SP2, and SP3. Each of the first and second channel patterns CH1 and CH2 may include the first to third semiconductor patterns SP1, SP2, and SP3.

For example, the first and second preliminary patterns PAP1 and PAP2 may be etched to form third and fourth recess regions RS3 and RS4. In an example embodiment, an upper portion of the first active pattern AP1 may be over-etched, and in this case, bottoms of the third recess regions RS3 may be lower than the top surface of the first active pattern AP1. Similarly, an upper portion of the second active pattern AP2 may be over-etched, and in this case, bottoms of the fourth recess regions RS4 may be lower than the top surface of the second active pattern AP2. The first channel pattern CH1 may be positioned between an adjacent pair of the third recess regions RS3, and the second channel pattern CH2 may be positioned between an adjacent pair of the fourth recess regions RS4.

The sacrificial layers 111 may be partially removed. Accordingly, the sacrificial layers 111 may be shorter than the first to third semiconductor patterns SP1, SP2, and SP3, in the second direction D2. The partial removal of the sacrificial layers 111 may include performing an isotropic etching process on the sacrificial layers 111 that are exposed through the third and fourth recess regions RS3 and RS4. The isotropic etching process may be performed to laterally recess side surfaces of the sacrificial layers 111 that are opposite to each other in the second direction D2, and thus, laterally-recessed regions may be formed. In the case where the first to third semiconductor patterns SP1, SP2, and SP3 include silicon (Si) and the sacrificial layers 111 include silicon-germanium (SiGe), the isotropic etching process may be performed using an etching solution including, for example, peracetic acid.

Thereafter, the blocking insulating layer BP may be formed to fill the laterally-recessed regions, from which the sacrificial layers 111 are partially removed. For example, the formation of the blocking insulating layer BP may include conformally forming a barrier insulating layer to fill the laterally-recessed regions and isotropically etching a portion of the barrier insulating layer. The barrier insulating layer may be formed of or include, for example, silicon nitride.

The first source/drain patterns SD1 may be formed to fill the third recess regions RS3. The formation of the first source/drain patterns SD1 may include performing a selective epitaxial process using the first active pattern AP1 and the first to third semiconductor patterns SP1, SP2, and SP3 thereon as a seed layer. The first source/drain patterns SD1 may be formed of or include a material capable of exerting a compressive strain on the first channel pattern CH1. As an example, the first source/drain patterns SD1 may be formed of or include a semiconductor material (e.g., SiGe) whose lattice constant is larger than a lattice constant of a semiconductor material of the substrate 100. The first source/drain patterns SD1 may be doped with p-type impurities during or after the selective epitaxial process.

The second source/drain patterns SD2 may be formed to fill the fourth recess regions RS4. The formation of the second source/drain patterns SD2 may include performing a selective epitaxial process using the second active pattern AP2 and the first to third semiconductor patterns SP1, SP2, and SP3 thereon as a seed layer. As an example, the second source/drain patterns SD2 may be formed of the same semiconductor material (e.g., Si) as the substrate 100. The second source/drain patterns SD2 may be doped with n-type impurities during or after the selective epitaxial process.

Figure 14:
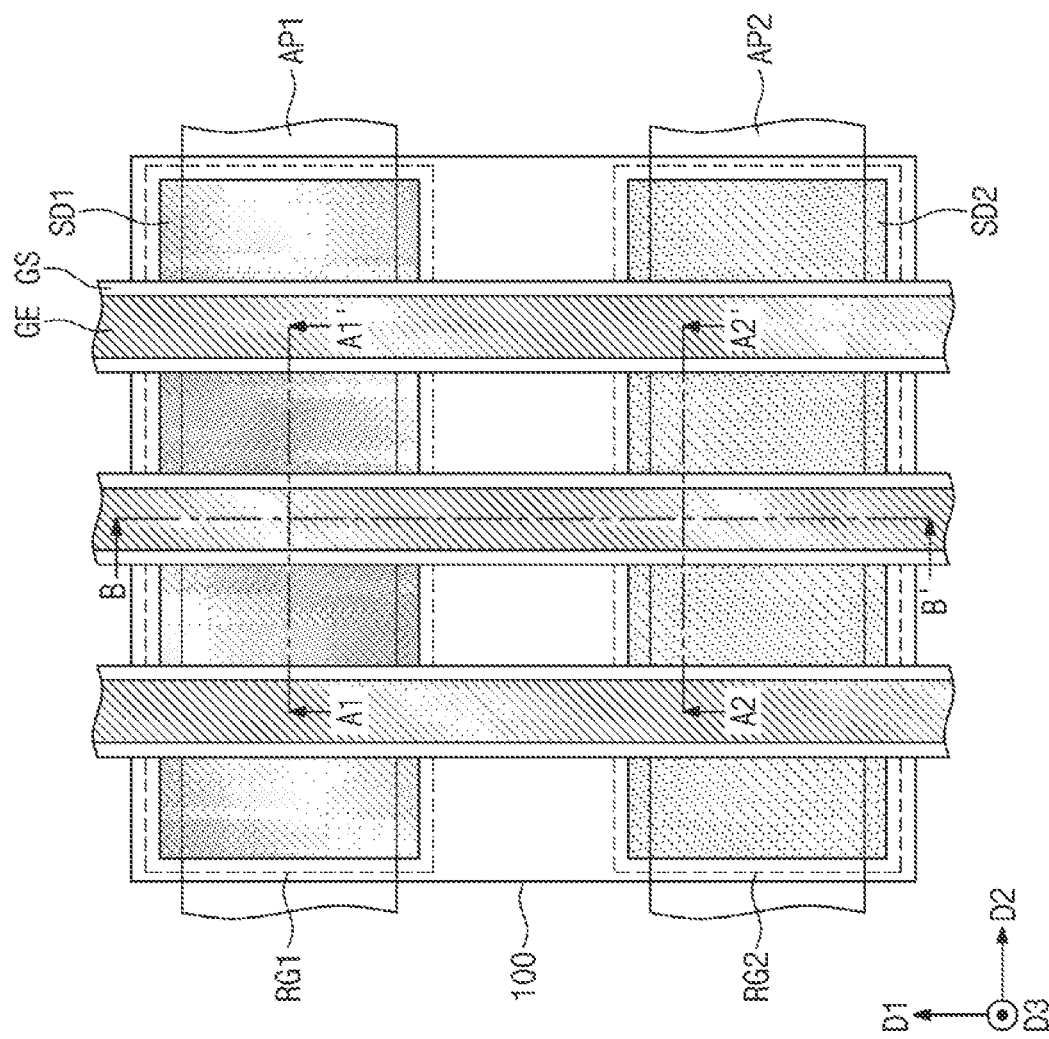
Figure 15A:
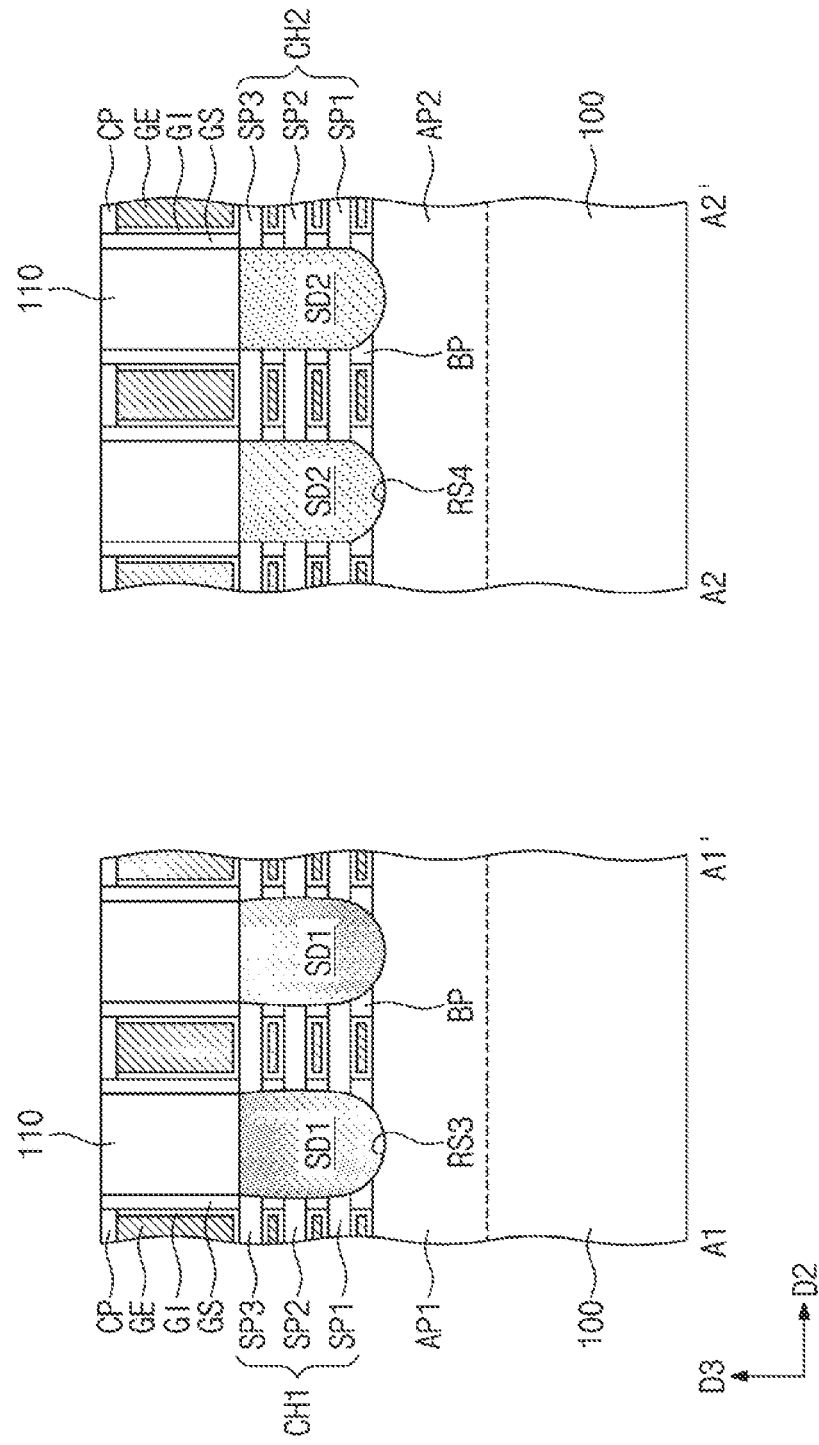
Figure 15B:
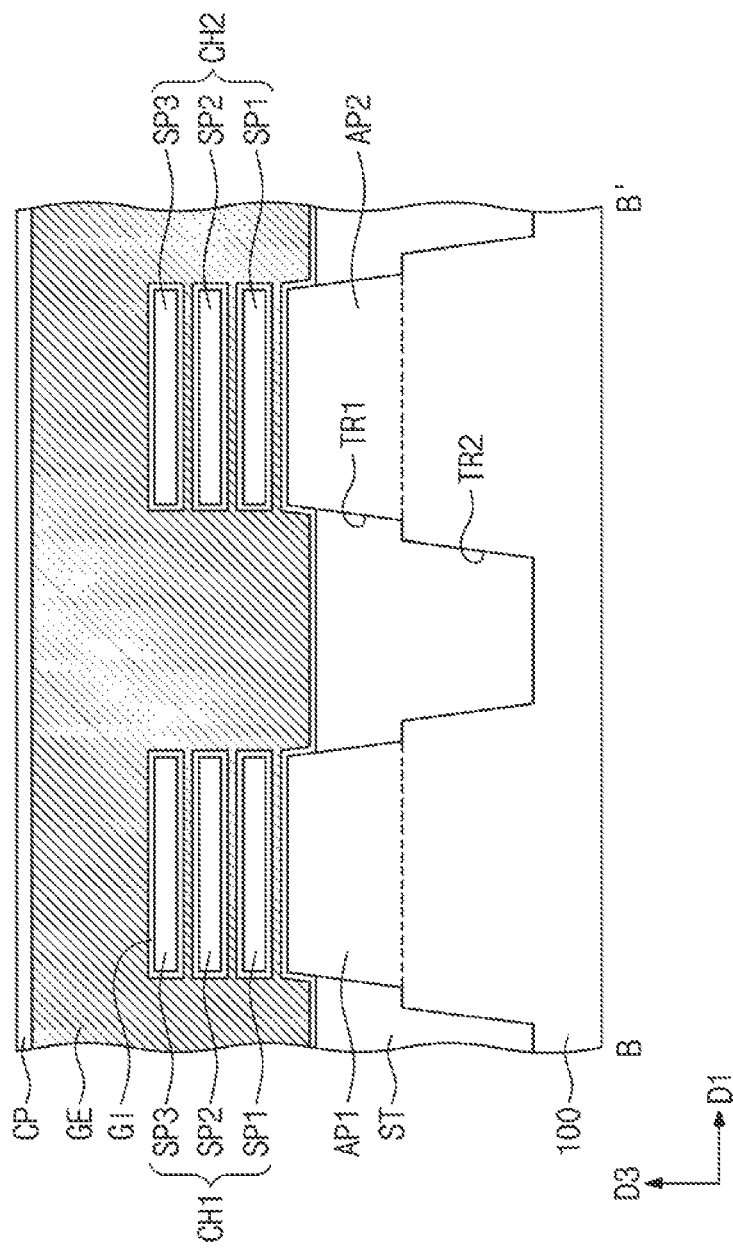

Referring to FIGS. 14, 15A, and 15B, the first interlayer insulating layer 110 may be formed on the substrate 100. Thereafter, a planarization process may be performed on the first interlayer insulating layer 110 to expose the top surfaces of the sacrificial patterns PP (e.g., see FIG. 13A). The planarization process may include, for example, an etch-back and/or chemical mechanical polishing (CMP) process. In an example embodiment, the mask patterns MP (e.g., see FIG. 13A) may also be removed when the first interlayer insulating layer 110 is planarized. The first interlayer insulating layer 110 may be formed of or include at least one of, for example, silicon oxide or silicon oxynitride.

The sacrificial patterns PP (e.g., see FIG. 13A) exposed by the planarization process may be selectively removed. As a result of the removal of the sacrificial patterns PP, an empty space may be formed between an adjacent pair of the gate spacers GS. The empty spaces may expose the first and second channel patterns CH1 and CH2 and the sacrificial layers 111 (e.g., see FIG. 13A). Next, the sacrificial patterns PP and the sacrificial layers 111, which are exposed through the empty spaces, may be selectively removed.

Thereafter, the gate dielectric pattern GI, the gate electrode GE and the gate capping pattern CP may be formed in the empty spaces from which the sacrificial patterns PP and the sacrificial layers 111 are removed. The gate dielectric pattern GI may be formed to conformally cover sides of the empty space but may not fill the entirety of the empty space. The gate dielectric pattern GI may be formed by, for example, an atomic layer deposition (ALD) process or a chemical oxidation process. The gate dielectric pattern GI may be formed of or include at least one of, for example, high-k dielectric materials.

The formation of the gate electrode GE may include forming a gate electrode layer to completely fill a remaining region of the empty space and planarizing the gate electrode layer. In an example embodiment, the gate electrode layer may be formed of or include at least one of conductive metal nitrides (e.g., titanium nitride and tantalum nitride) or metallic materials (e.g., titanium, tantalum, tungsten, copper, and aluminum).

Next, upper portions of the gate electrodes GE may be recessed and then the gate capping patterns CP may be formed on the gate electrodes GE. The gate capping patterns CP may be formed to completely fill the recessed regions of the gate electrodes GE. The gate capping patterns CP may be formed of or include at least one of, for example, SiON, SiCN, SiCON, or SiN.

Figure 16A:
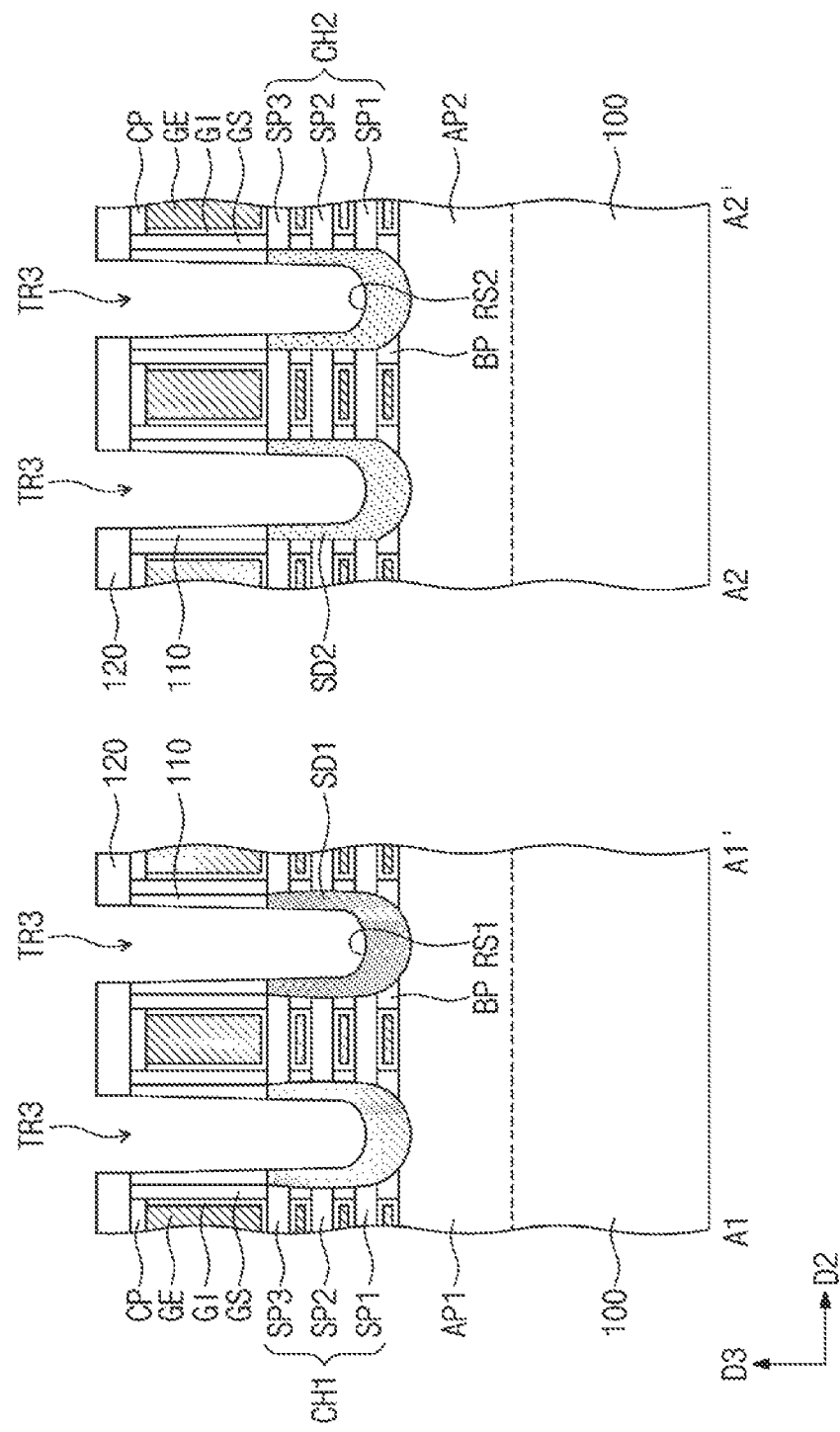
Figure 16B:
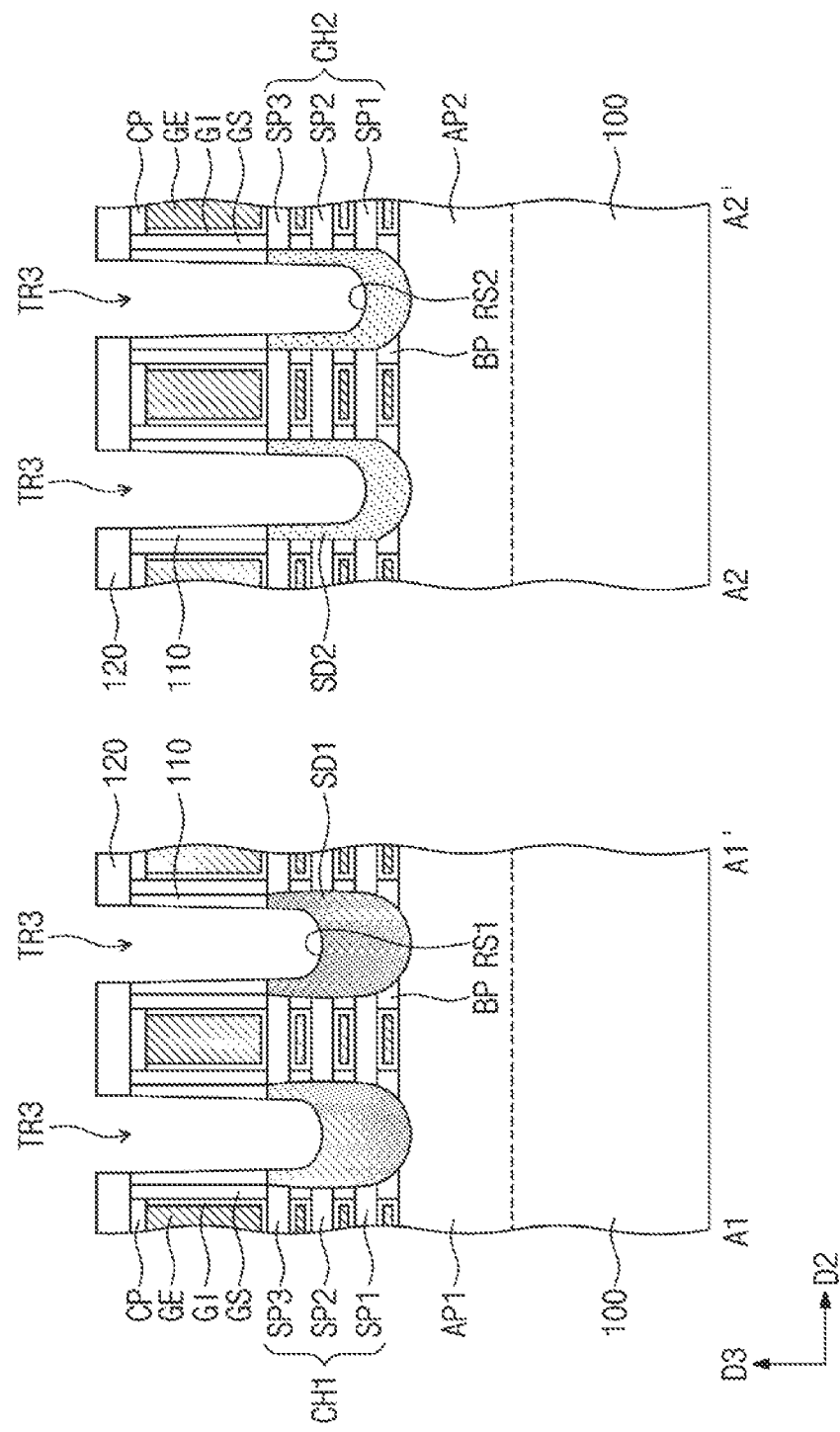

Referring to FIGS. 16A and 16B, the second interlayer insulating layer 120 may be formed, and a third trench TR3 may be formed to penetrate the first and second interlayer insulating layers 110 and 120 and to expose the first and second source/drain patterns SD1 and SD2. During the formation of the third trench TR3, the first and second source/drain patterns SD1 and SD2 may be partially removed to form the first and second recess regions RS1 and RS2. The first recess region RS1 may be an empty region that is formed by recessing the top surface of the first source/drain pattern SD1 in a downward direction. The second recess region RS2 may be an empty region that is formed by recessing the top surface of the second source/drain pattern SD2 in a downward direction. The formation of the third trench TR3 may include performing a first etching process to remove a portion of the first interlayer insulating layer 110 and a portion of the second interlayer insulating layer 120 and performing a second etching process to etch top surfaces of the first and second source/drain patterns SD1 and SD2 that are exposed by the first etching process. In each of the first and second recess regions RS1 and RS2, widths in the first and second directions D1 and D2 may decrease with decreasing distance from the substrate 100. In an example embodiment, the first recess region RS1 and the second recess region RS2 may be formed to the same depth, as shown in FIG. 16A. In another embodiment, the first recess region RS1 and the second recess region RS2 may be formed to different depths, as shown in FIG. 16B. For example, the second recess region RS2 may be formed to be deeper than the first recess region RS1. The second region RG2, on which the second recess region RS2 is formed, may be an NMOSFET region.

Figure 17:
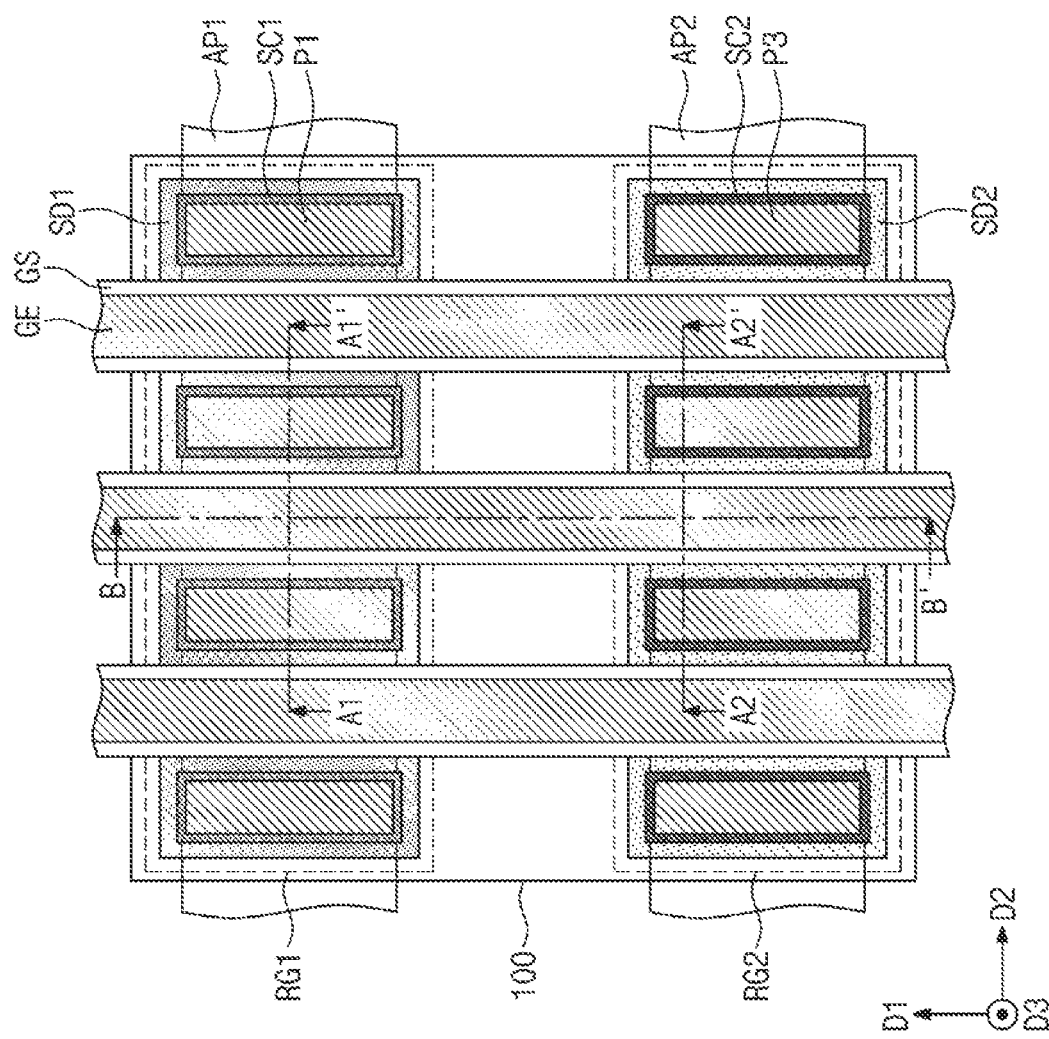
Figure 18:
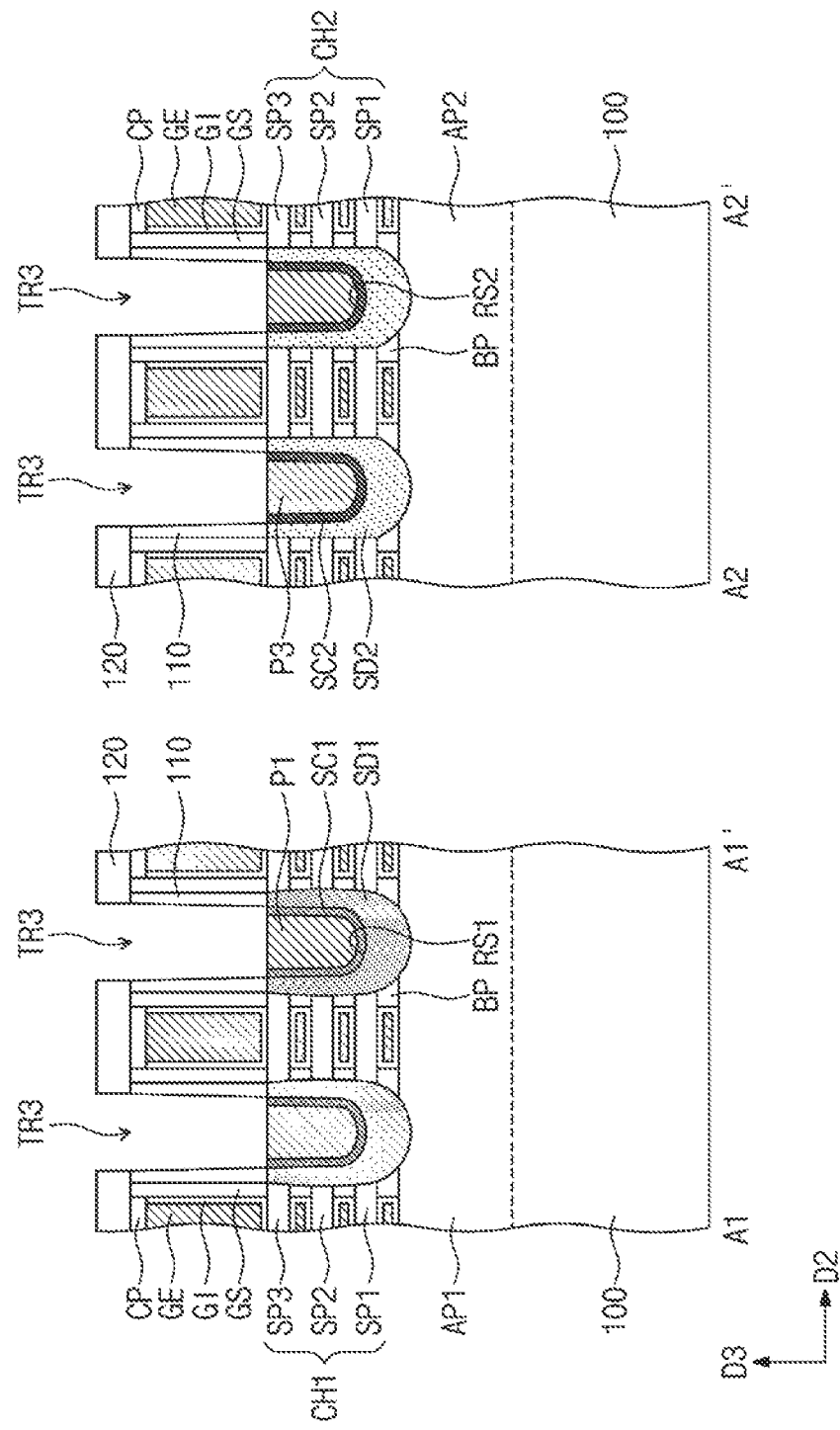

Referring to FIGS. 17 and 18, the first portion P1 of the contact plug may be formed in the first recess region RS1, and the third portion P3 of the contact plug may be formed in the second recess region RS2.

Before the formation of the contact plugs, the first interface layer SC1 may be formed between the first portion P1 and the first source/drain pattern SD1, and the second interface layer SC2 may be formed between the third portion P3 and the second source/drain pattern SD2. The first and second interface layers SC1 and SC2 may be formed to conformally cover the inner side surfaces of the first and second recess regions RS1 and RS2, respectively. The first and third portions P1 and P3 may be formed to fill remaining regions of the first and second recess regions RS1 and RS2, respectively.

Figure 19:
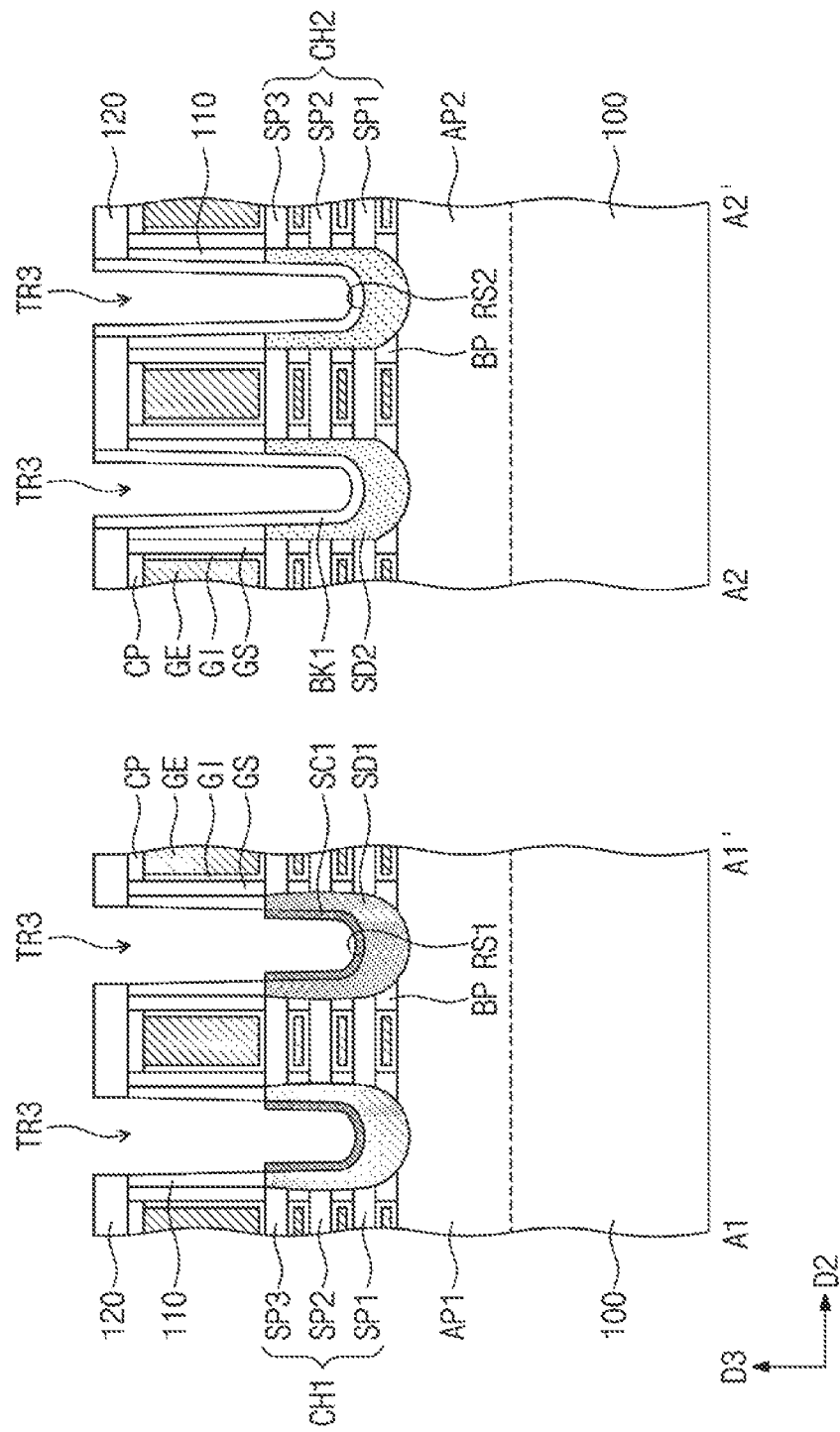

In an example embodiment, referring to FIG. 19, a first blocking insulating layer BK1 may be formed to cover an inner side surface of the third trench TR3 on the second region RG2. The first blocking insulating layer BK1 may be formed by, for example, an atomic layer deposition process. The first blocking insulating layer BK1 may be formed of or include, for example, silicon oxide. Thereafter, the first interface layer SC1 may be selectively formed on the inner side surface of the first recess region RS1. The formation of the first interface layer SC1 may include forming a first metal layer (not shown) to cover the inner side surface of the first recess region RS1 and performing a thermal treatment process on the first metal layer to change the first metal layer to a silicide layer. The formation of the first metal layer may include selectively depositing the first metal layer on an exposed surface of the second source/drain pattern SD2.

Figure 20:
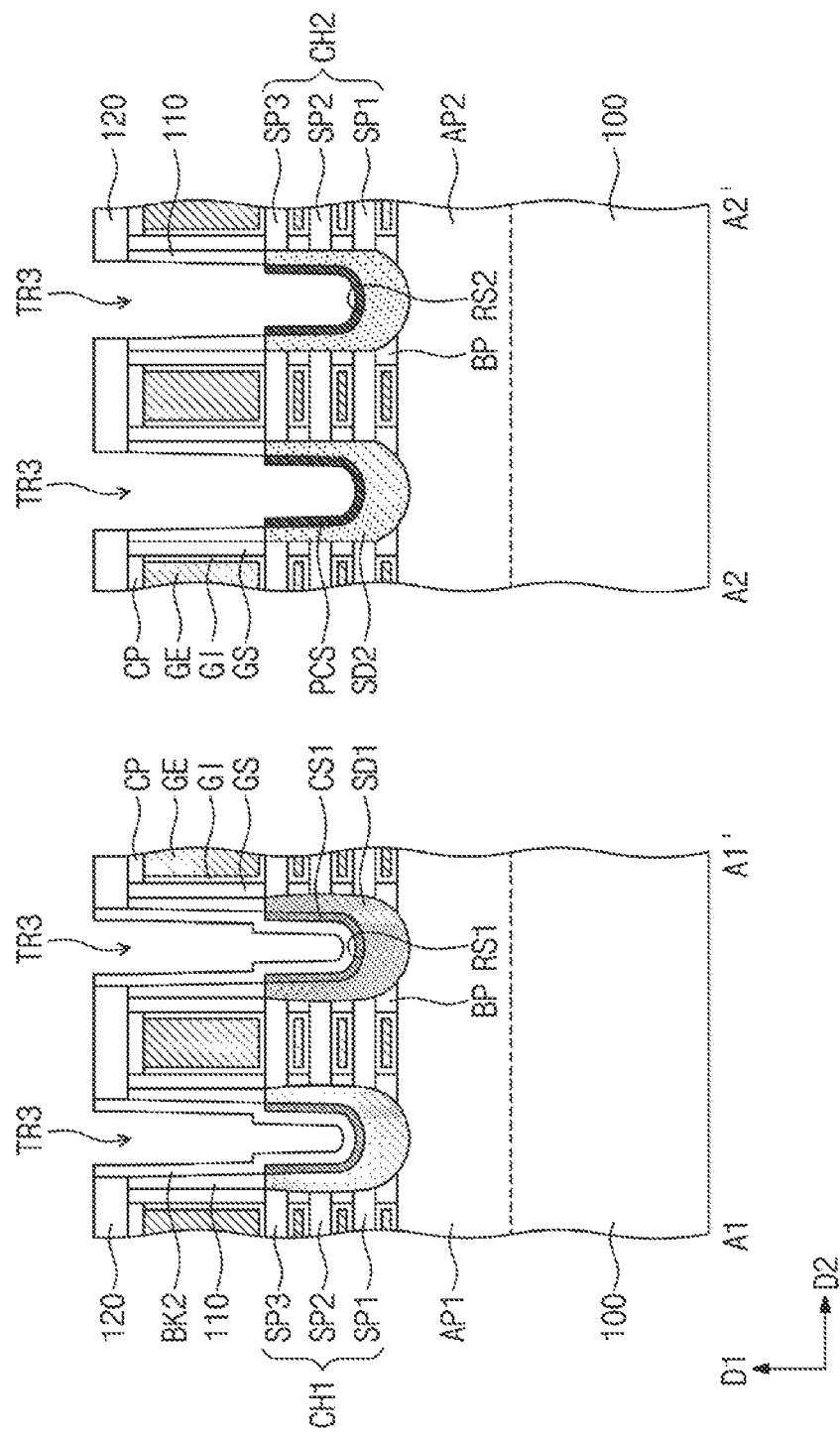

Referring to FIG. 20, the first blocking insulating layer BK1 may be removed, and a second blocking insulating layer BK2 may be formed to cover the inner side surface of the third trench TR3 and the exposed surface of the first interface layer SC1, on the first region RG1. Next, a second metal layer PCS may be formed to cover the inner side surface of the second recess region RS2. The formation of the second metal layer PCS may include selectively depositing the second metal layer PCS on an exposed surface of the second source/drain pattern SD2. The second metal layer PCS may be formed of or include a conductive material. The second metal layer PCS may be formed of, for example, a nitrogen-free material.

Referring to FIGS. 18 and 20, the third portion P3 of the contact plug may be formed to fill the remaining region of the second recess region RS2 provided with the second metal layer PCS. Additionally, the first portion P1 of the contact plug may be formed to fill the remaining region of the first recess region RS1 provided with the first interface layer SC1. The first and third portions P1 and P3 of the contact plugs may be formed at the same time. A barrier layer may not be formed between the third portion P3 and the second metal layer PCS. For example, the third portion P3 may be directly formed on the second metal layer PCS. The second metal layer PCS may be changed to the first interface layer SC1 by heat energy, which is supplied during the formation of the first and third portions P1 and P3. The third portion P3 may be directly formed on the second metal layer PCS. Thus, the formation of the first interface layer SC1 may include directly forming the contact plug on the second metal layer PCS, and in this case, the second metal layer PCS may be directly changed to a silicide layer. Although the first interface layer SC1 is described as being formed before the formation of the second interface layer SC2, in an example embodiment, the process of forming the second interface layer SC2 may be performed before the process of forming the first interface layer SC1.

Figure 21:
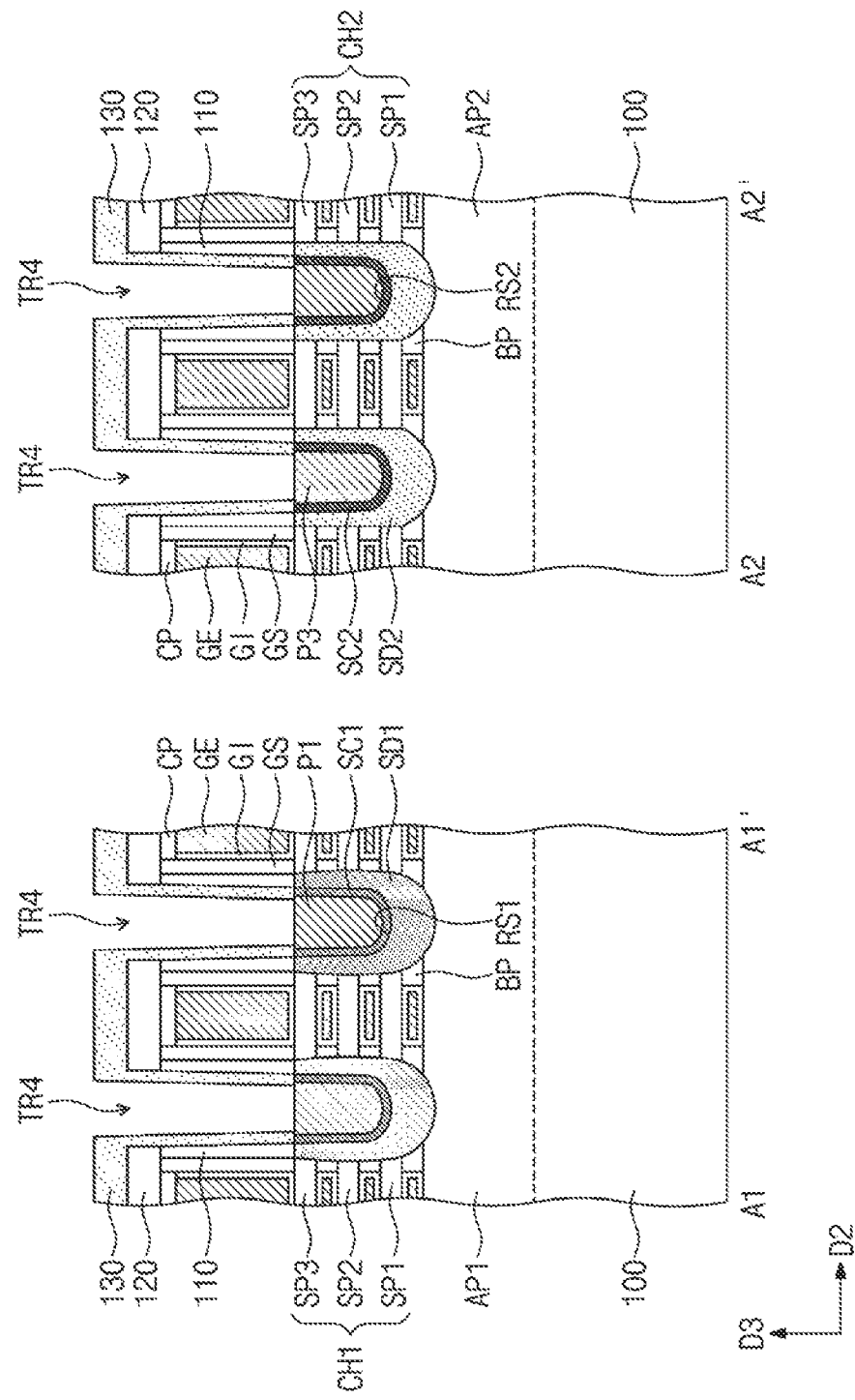

Referring to FIG. 21, the third interlayer insulating layer 130 may be formed on the second interlayer insulating layer 120. The third interlayer insulating layer 130 may be formed of or include at least one of, for example, silicon oxide or silicon oxynitride. The third interlayer insulating layer 130 may be formed to cover the top surface of the second interlayer insulating layer 120 and to fill the remaining region of the third trench TR3 (e.g., see FIG. 18). Thereafter, the second interlayer insulating layer 120 may be patterned to form a fourth trench TR4 exposing the top surface of the first portion P1 and the top surface of the third portion P3. Referring back to FIG. 2A, the second portion P2 may be formed to fill the fourth trench TR4 on the first region RG1, and the fourth portion P4 may be formed to fill the fourth trench TR4 on the second region RG2. In an example embodiment, the second portion P2 and the fourth portion P4 may be formed at the same time.

As described above, embodiments may provide a semiconductor device including a gate-all-around type transistor with improved electric characteristics.

According to an example embodiment, an interface layer interposed between a contact plug and a source/drain pattern may include different metallic elements in a PMOSFET region and an NMOSFET region, and thus, it may be possible to improve electric characteristics of a semiconductor device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a first channel pattern and a second channel pattern on a substrate, each of the first and second channel patterns including vertically-stacked semiconductor patterns;
a first source/drain pattern connected to the first channel pattern;
a second source/drain pattern connected to the second channel pattern, the first and second source/drain patterns having different conductivity types from each other;
a first contact plug inserted in the first source/drain pattern, and a second contact plug inserted in the second source/drain pattern;
a first interface layer interposed between the first source/drain pattern and the first contact plug; and
a second interface layer interposed between the second source/drain pattern and the second contact plug, the first and second interface layers including metallic elements,
wherein a thickness of the first interface layer and a thickness of the second interface layer are different from each other.

2. The device of claim 1, wherein the first and second interface layers include different metallic elements from each other,
wherein the thickness of the first interface layer is greater than the thickness of the second interface layer.

3. The device of claim 2, wherein the first interface layer is disposed on a PMOSFET region.

4. The device of claim 2, further comprising:
an interlayer insulating layer covering the first and second source/drain patterns,
wherein the first contact plug includes a first portion, which is buried in the first source/drain pattern, and a second portion, which penetrates the interlayer insulating layer and is connected to the first portion,
wherein the second contact plug includes a third portion, which is buried in the second source/drain pattern, and a fourth portion, which penetrates the interlayer insulating layer and is connected to the third portion,
wherein a width of a top portion of the first portion is smaller than a width of a top portion of the third portion.

5. The device of claim 1, wherein the first and second interface layers include same metallic elements,
wherein the thickness of the first interface layer is smaller than the thickness of the second interface layer.

6. The device of claim 5, wherein the second interface layer is disposed on a NMOSFET region.

7. The device of claim 5, further comprising:
an interlayer insulating layer covering the first and second source/drain patterns,
wherein the first contact plug includes a first portion, which is buried in the first source/drain pattern, and a second portion, which penetrates the interlayer insulating layer and is connected to the first portion,
wherein the second contact plug includes a third portion, which is buried in the second source/drain pattern, and a fourth portion, which penetrates the interlayer insulating layer and is connected to the third portion,
wherein a width of a top portion of the first portion is greater than a width of a top portion of the third portion.

8. The device of claim 1, the first and second interface layers include at least one of titanium silicide (TiSi), tungsten silicide (WSi), cobalt silicide (CoSi), nickel silicide (NiSi), molybdenum silicide (MoSi), or tantalum silicide (TaSi).

9. The device of claim 1, further comprising:
an interlayer insulating layer covering the first and second source/drain patterns,
wherein an uppermost surface of the first interface layer contacts directly with a first bottom surface of the interlayer insulating layer,
wherein an uppermost surface of the second interface layer contacts directly with a second bottom surface of the interlayer insulating layer.

10. The device of claim 9, wherein a width of the bottom surface of the interlayer insulating layer is greater than the thickness of the first interface layer and the thickness of the second interface layer.

11. The device of claim 1, wherein a lowermost surface of the first interface layer and a lowermost surface of the second interface layer are located between an upper surface and a lower surface of a lowermost semiconductor pattern of the vertically-stacked semiconductor patterns.

12. A semiconductor device, comprising:
a first channel pattern and a second channel pattern on a substrate, each of the first and second channel patterns including vertically-stacked semiconductor patterns;
a first source/drain pattern connected to the first channel pattern;
a second source/drain pattern connected to the second channel pattern, the first and second source/drain patterns having different conductivity types from each other;
a first contact plug inserted in the first source/drain pattern, and a second contact plug inserted in the second source/drain pattern;

a first interface layer interposed between the first source/drain pattern and the first contact plug;

a second interface layer interposed between the second source/drain pattern and the second contact plug; and interlayer insulating layers covering the first and second source/drain patterns, wherein two portions of the first contact plug are continuously connected to each other and two portions of the second contact plug are continuously connected to each other, wherein the first and second interface layers including different metallic elements from each other.

13. The device of claim 12, wherein each of the first contact plug and the second contact plug does not include interfacial surface therebetween.

14. The device of claim 12, wherein the interlayer insulating layers include a first interlayer insulating layer, a second interlayer insulating layer and a third interlayer insulating layer, wherein the first interface layer has a surface that is aligned to a first inner side surface of the third interlayer insulating layer.

15. The device of claim 14, wherein the second interface layer has a surface that is aligned to a second inner side surface of the third interlayer insulating layer.

16. The device of claim 12, wherein the interlayer insulating layers include a first interlayer insulating layer, a second interlayer insulating layer and a third interlayer insulating layer, wherein an uppermost surface of the first interface layer contacts directly with a first bottom surface of the third interlayer insulating layer, wherein an uppermost surface of the second interface layer contacts directly with a second bottom surface of the third interlayer insulating layer.

17. The device of claim 12, wherein a lowermost surface of the first interface layer and a lowermost surface of the second interface layer are located between an upper surface and a lower surface of a lowermost semiconductor pattern of the vertically-stacked semiconductor patterns.

18. A semiconductor device, comprising:

a substrate having a first active region and a second active region;

a first channel pattern on the first active region, and a second channel pattern on the second active region, and each of the first channel pattern and the second channel pattern including vertically-stacked semiconductor patterns;

a gate electrode extended in a first direction to cross the first and second channel patterns;

a first source/drain pattern disposed at a first side of the gate electrode and connected to the first channel pattern;

a second source/drain pattern disposed at a second side of the gate electrode and connected to the second channel pattern, and having a different conductivity type from the first source/drain pattern;

an interlayer insulating layer covering the gate electrode, the first source/drain pattern, and the second source/drain pattern;

a first contact plug including a first portion, which is buried in the first source/drain pattern, and a second portion, which penetrates the interlayer insulating layer and is connected to the first portion;

a second contact plug including a third portion, which is buried in the second source/drain pattern, and a fourth portion, which penetrates the interlayer insulating layer and is connected to the third portion;

a first interface layer interposed between the first portion and the first source/drain pattern; and a second interface layer interposed between the third portion and the second source/drain pattern, the first and second interface layers including different elements from each other, wherein the first and second interface layers include at least one of titanium silicide (TiSi), tungsten silicide (WSi), cobalt silicide (CoSi), nickel silicide (NiSi), molybdenum silicide (MoSi), or tantalum silicide (TaSi), wherein a thickness of the first interface layer and a thickness of the second interface layer are different from each other.

19. The device of claim 18, wherein a top surface of the first source/drain pattern, a top surface of the first interface layer and a top surface of the first portion are substantially coplanar.

20. The device of claim 18, wherein a top surface of the second source/drain pattern, a top surface of the second interface layer and a top surface of the third portion are substantially coplanar.

* * * * *